United States Patent
Atabaki et al.

(10) Patent No.: US 11,605,752 B2
(45) Date of Patent: Mar. 14, 2023

(54) RESONANCE ENHANCED SURFACE ILLUMINATED SUB-BANDGAP INFRARED PHOTODETECTORS

(71) Applicant: Massachusetts Institute of Technology, Cambridge, MA (US)

(72) Inventors: Amir H. Atabaki, San Francisco, CA (US); Rajeev J. Ram, Arlington, MA (US); Ebrahim Dakhil Al Johani, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 187 days.

(21) Appl. No.: 17/032,223

(22) Filed: Sep. 25, 2020

(65) Prior Publication Data

US 2021/0091252 A1 Mar. 25, 2021

Related U.S. Application Data

(60) Provisional application No. 62/905,623, filed on Sep. 25, 2019.

(51) Int. Cl.
*H01L 31/105* (2006.01)
*H01L 31/0368* (2006.01)
*H01L 27/146* (2006.01)

(52) U.S. Cl.
CPC .... *H01L 31/1055* (2013.01); *H01L 31/03685* (2013.01); *H01L 27/14649* (2013.01)

(58) Field of Classification Search
CPC ............... H01L 31/1055; H01L 31/105; H01L 31/03685; H01L 31/0368; H01L 31/03682; H01L 31/0352; H01L 27/14649; H01L 27/146; B82Y 20/00; G02B 6/1225
USPC ........................................................ 257/431
See application file for complete search history.

(56) References Cited

U.S. PATENT DOCUMENTS

2016/0308075 A1* 10/2016 Wang .................. H01L 27/1446

OTHER PUBLICATIONS

Alloatti et al., "Infrared vertically-illuminated photodiode for chip alignment feedback." AIP Advances 6.8 (2016): 085219. 8 pages.
Amirmazlaghani et al., "Graphene-si Schottky IR detector." IEEE Journal of Quantum electronics 49.7 (2013) 589-594.
Atlasov et al., "Observation of wavelength-and loss-splitting of supermodes in coupled photonic-crystal microcavities." Conference on Lasers and Electro-Optics. Optical Society of America, 2008. 2 pages.
Bravo-Abad et al., "Ultrafast photodetection in an all-silicon chip enabled by two-photon absorption." Applied Physics Letters 94.24 (2009): 241103. 4 pages.

(Continued)

*Primary Examiner* — Calvin Y Choi
(74) *Attorney, Agent, or Firm* — Smith Baluch LLP

(57) ABSTRACT

Photodetectors using photonic crystals (PhCs) in polysilicon film that include an in-plane resonant defect. A biatomic photodetector includes an optical defect mode that is confined from all directions in the plane of the PhC by the photonic bandgap structure. The coupling of the resonance (or defect) mode to out-of-plane radiation can be adjusted by the design of the defect. Further, a "guided-mode resonance" (GMR) photodetector provides in-plane resonance through a second-order grating effect in the PhC. Absorption of an illumination field can be enhanced through this resonance.

8 Claims, 24 Drawing Sheets

(56) References Cited

OTHER PUBLICATIONS

Casalino et al., "Critically coupled silicon Fabry-Perot photodetectors based on the internal photoemission effect at 1550 nm." Optics express 20.11 (2012): 12599-12609.
Casalino et al., "Near-infrared sub-bandgap all-silicon photodetectors: state of the art and perspectives." Sensors 10.12 (2010): 10571-10600.
Casalino et al., "Vertically illuminated, resonant cavity enhanced, graphene-silicon Schottky photodetectors." ACS nano 11.11 (2017): 10955-10963.
Chen et al., "Cavity-enhanced photocurrent generation by 1.55 μm wavelengths linear absorption in a pin diode embedded silicon microring resonator." Applied physics letters 95.17 (2009): 171111. 4 pages.
Choquette et al., "Single Mode Photonic Crystal Vertical Cavity Surface Emitting Lasers." Advances in Optical Technologies (2012). 9 pages.
Desiatov et al., "Plasmonic enhanced silicon pyramids for internal photoemission Schottky detectors in the near-infrared regime." Optica 2.4 (2015): 335-338.
Englund et al., "General recipe for designing photonic crystal cavities." Optics express 13.16 (2005): 5961-5975.
Fang et al., "Accurate characterization of next-generation thin-film photodetectors." Nat. Photonics 13.1 (2019): 1-4.
Goykhman et al., "Locally oxidized silicon surface-plasmon Schottky detector for telecom regime." Nano letters 11.6 (2011): 2219-2224.
Green, "Self-consistent optical parameters of intrinsic silicon at 300 K including temperature coefficients." Solar Energy Materials and Solar Cells 92.11 (2008): 1305-1310.
Haddadi et al., "High quality beaming and efficient free-space coupling in L3 photonic crystal active nanocavities." Optics express 20.17 (2012): 18876-18886.
Jalali et al., "Silicon photonics." Journal of lightwave technology 24.12 (2006): 4600-4615.
Joannopoulos et al., "Molding the flow of light." Princeton Univ. Press, Princeton, NJ [ua] (2008). 12 pages.
Joannopoulos et al., "Photonic crystals: putting a new twist on light." Nature 386.6621 (1997): 143-149.
Johani et al., Photonic crystal enhanced silicon photodetector as a near-IR sensor, #5.06. Microsystems Technology Laboratories Annual Research Conference 2019. 1 page.
Johani et al., Towards Low-cost Infrared CMOS Sensors. MIT EECS Presentation Apr. 10, 2019. 3 pages.
Johani, POE Group Meeting Presentation. MIT Apr. 10, 2019. 18 pages.
Johani, Resonant Cavity-Enhanced Photodetectors Presentation. MIT Feb. 13, 2019. 31 pages.
Kalchmair et al., "Detectivity enhancement in quantum well infrared photodetectors utilizing a photonic crystal slab resonator." Optics Express 20.5 (2012): 5622-5628.
Mehta et al., "High-Q CMOS-integrated photonic crystal microcavity devices." Scientific reports 4 (2014): 4077. 6 pages.
Oskooi et al., A flexible free-software package for electromagnetic simulations by the FDTD method. Computer Physics Communications, 181(3):687-702, 2010. 30 pages.
Poulton et al., "Photonic crystal microcavities in a microelectronics 45-nm SOI CMOS technology." IEEE Photonics Technology Letters 27.6 (2015): 665-668.
Reininger et al., "Photonic crystal slab quantum cascade detector." Applied Physics Letters 103.24 (2013): 241103. 5 pages.
Shemeya et al., "Comparison of photonic-crystal-enhanced thermophotovoltaic devices with and without a resonant cavity." Journal of electronic materials 41.5 (2012): 928-934.
Soljačić et al., "Photonic-crystal slow-light enhancement of non-linear phase sensitivity." JOSA B 19.9 (2002): 2052-2059.
Tanabe et al., "All-silicon sub-GB/s telecom detector with low dark current and high quantum efficiency on chip." Applied Physics Letters 96.10 (2010): 101103.4 pages.
Tanzid et al., "Combining plasmonic hot carrier generation with free carrier absorption for high-performance near-infrared silicon-based photodetection." ACS Photonics 5.9 (2018): 3472-3477.
Vahala, "Optical microcavities." Nature 424.6950 (2003): 839-846.
Vučković et al,. "Design of photonic crystal microcavities for cavity QED." Physical Review E 65.1 (2001): 016608. 11 pages.
Vuckovic et al., "Optimization of the Q factor in photonic crystal microcavities." IEEE Journal of Quantum Electronics 38.7 (2002): 850-856.
Voshie et al., "High quality two-dimensional photonic crystal slab cavities." Applied Physics Letters 79.26 (2001) 4289-4291.
Zhu et al., "Low-cost and high-speed SOI waveguide-based silicide Schottky-barrier MSM photodetectors for broadband optical communications." IEEE Photonics Technology Letters 20.16 (2008): 1396-1398.

\* cited by examiner

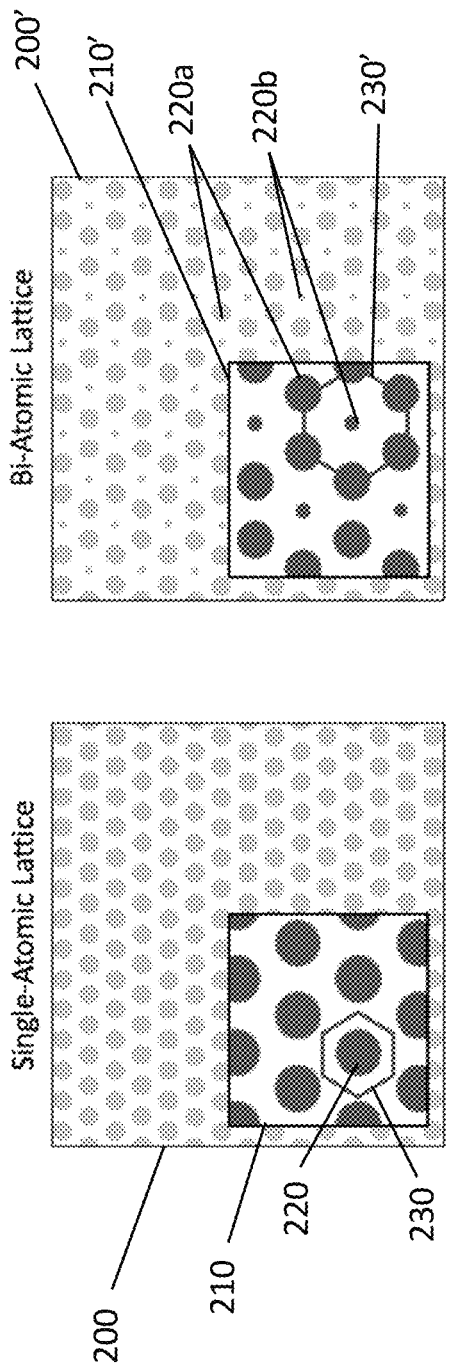
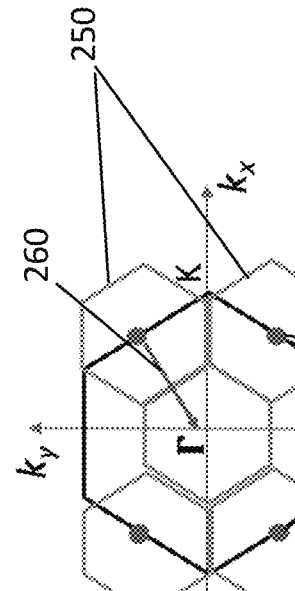
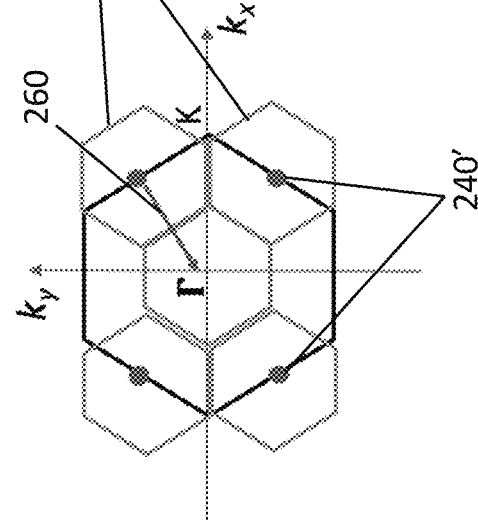
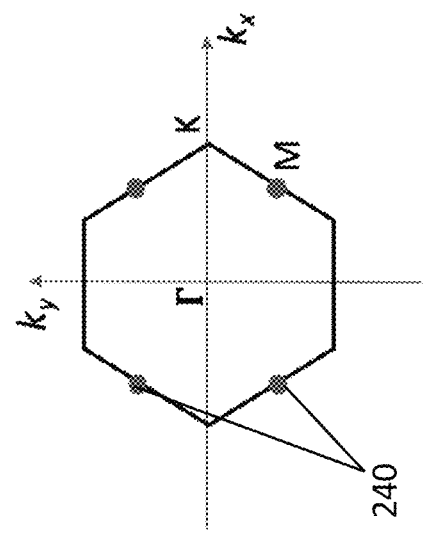
FIG. 2A
FIG. 2B
FIG. 2C
FIG. 2D

| Type Device | Material | Responsivity (mA/W) | Dark Current (pA) | Wavelength (nm) | NEP (pW/Hz) |
|---|---|---|---|---|---|
| F-P microcavity enhanced | Silicon, 100μm depth | 0.063 | 3.5 × 10$^9$ (-0.1V) | 1550 | 5.3e5 |
| — | Graphene-Silicon Schottky junction | 9.9 (-16V) | 2.4 × 10$^6$ (-16V) | 1550 | 88.6 |
| Silicon Pyramids (apex ~50μm$^2$) | Al-Silicon Schottky junction | 12 (-100mV) | 8 × 10$^4$ (-100mV) | 1300 | 13.3 |
| Lateral PN, 45nm CMOS (12SOI) | SiGe, 10μm × 10μm | 0.032 | 10 (-2V) | 1080 | 56 |
| F-P cavity enhanced | Graphene-Silicon Schottky junction | 20 (-10V) | 0.15 × 10$^9$ (-10V) | 1550 | 350 |
| Plasmonic and Free Carrier of highly doped Si | Au-Pd grating 0.9×0.5μm | 10$^3$ (-275mV) | 3.5 (-275mV) | 1375 | 10 |

FIG. 5

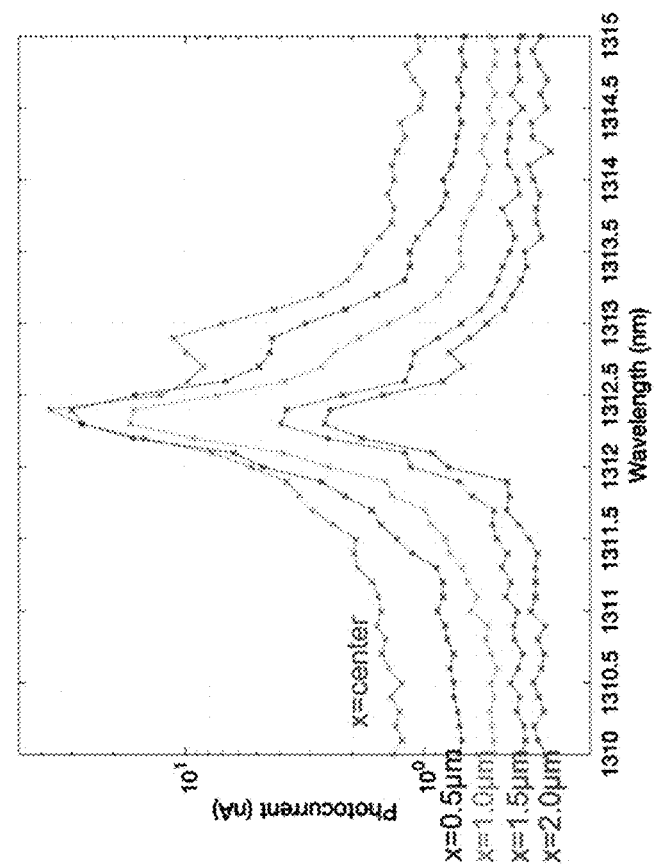
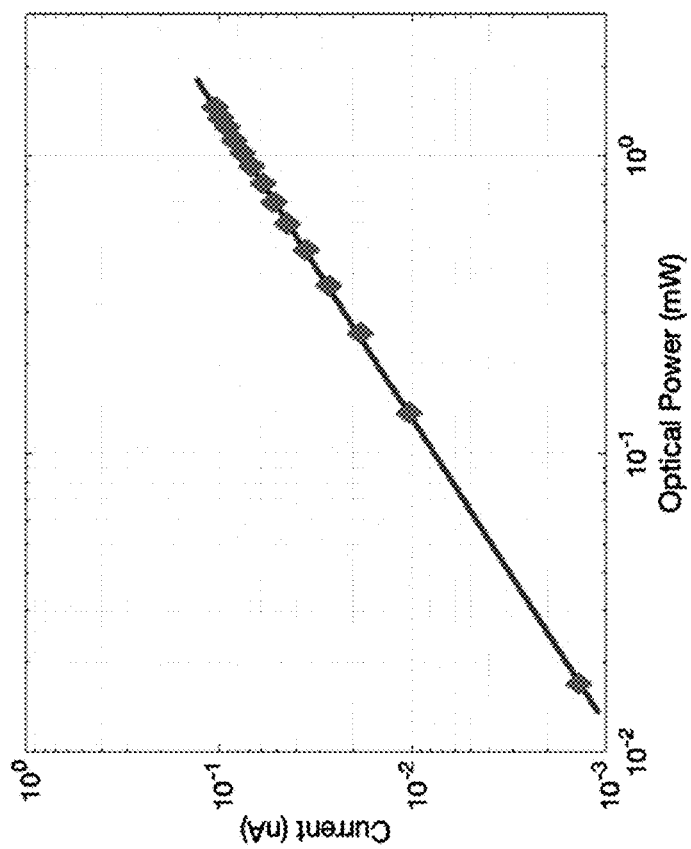
FIG. 12B
FIG. 12A

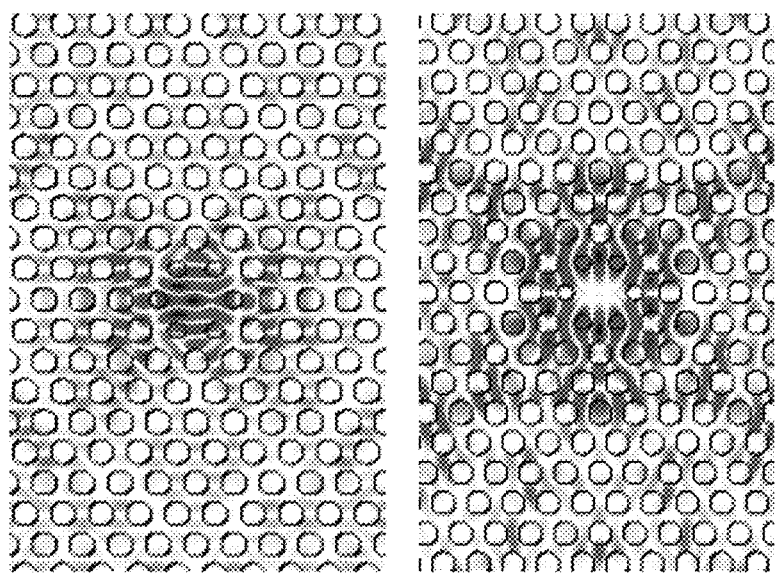
FIG. 15B
FIG. 15C
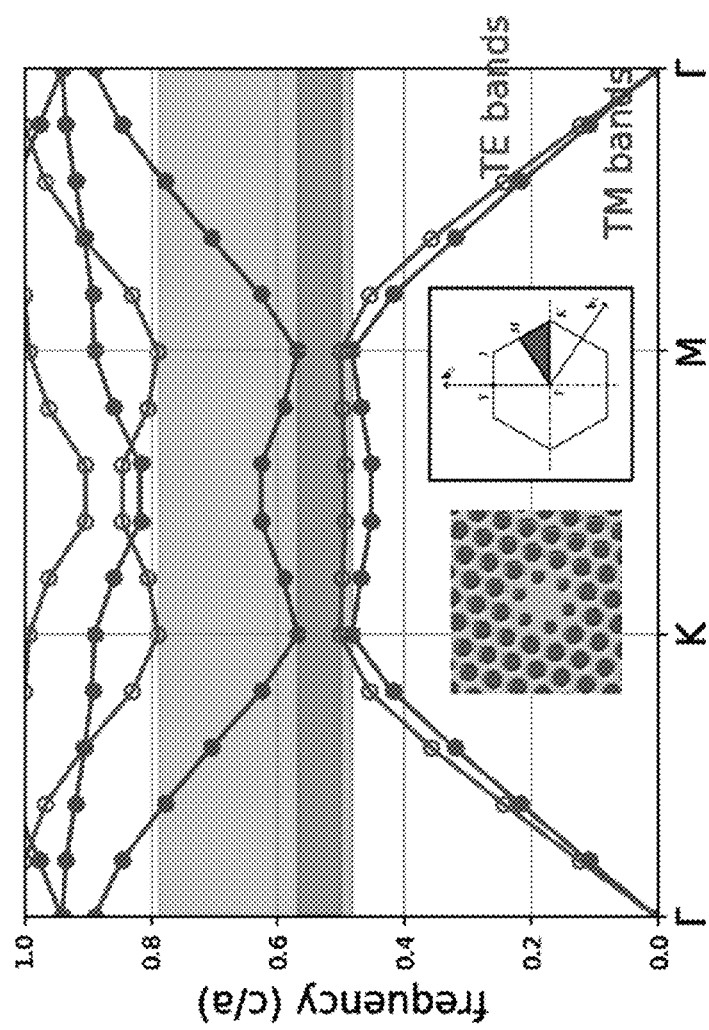
FIG. 15A

RESONANCE ENHANCED SURFACE ILLUMINATED SUB-BANDGAP INFRARED PHOTODETECTORS

CROSS-REFERENCE TO RELATED APPLICATIONS

This application claims priority to U.S. Provisional Application No. 62/905,623 filed Sep. 25, 2019, the entire disclosure of which is incorporated herein by reference.

STATEMENT OF GOVERNMENT SUPPORT

This invention was made with Government support under Grant No. HR0011-11-C-0100 awarded by the Defense Advanced Research Projects Agency (DARPA). The Government has certain rights in the invention.

BACKGROUND

Silicon is becoming the most widely used material in fiber-based communication for its integrability with most electronics. Leveraging complementary metal-oxide-semiconductor (CMOS) fabrication techniques for silicon facilitated many of these advancements. However, the indirect bandgap of crystalline silicon poses some optical limitations. An indirect transition constrains a silicon crystal to undergo a momentum exchange every time a photon is absorbed or emitted, which reduces light absorption dramatically. In addition, near-infrared (NIR) wavelength photons have lower energy than the bandgap of silicon and cause even lower levels of generation. However, there are a few phenomenon that could be harnessed to enable sub-bandgap absorption; these include surface-state-assisted, virtual-state-assisted, as well as phonon-assisted absorption which allow for more than one low energy mechanism to add their energies and overcome the gap.

The aforementioned effects result in an absorption depth of crystalline silicon around the order of $10^4$ cm at 1300 nm and orders of magnitude higher at longer wavelengths. This provides a challenge which has been tackled from the following directions.

One approach to enhancing low-absorbing silicon is to expose it to high levels of deuteron and neutron radiation. The damage radiation causes to the crystal creates mid-bandgap states that ultimately lowers the weak-absorption effects. A different method utilizes the Schottky diode effect, where a metal layer is placed near the semiconductor junction. The electrons generated near the metal surface carry kinetic energy, which allows the electrons to overcome the energy gap. This method, however, involves applying a high external reverse voltage to provide electrons with a high enough energy. Moreover, a common method uses light confining structures to increase the effective path-length of light in the material. Resonance-enhanced devices add a Fabry-Perot cavity, creating an enhancement factor given by Q/V, where Q is the quality factor of the resonator and V is the mode volume.

There are various mechanisms by which sub-bandgap absorption can occur. Out of these, the internal photoelectric effect (IPE) and two photon absorption (TPA) are the most utilized in engineering detector junctions for sub bandgap photons. The highest responsivity devices applying these absorption mechanisms are the Schottky and resonator designs with 2.3-13.3 mA/W and 0.25 mA/W, respectively. With TPA in particular being a non-linear process, the efficiency of detectors based on TPA can dependent on input light level, and hence can be low for low input light levels.

A CMOS-compatible enhancement mechanism called photonic crystal (PhC) microcavities has been proposed as an alternative method. By engineering a periodic dielectric structure, it is possible to create in-plane light-confining structures that are compatible with silicon CMOS. Experimental work in waveguide-based and thermophotovoltaic devices have demonstrated an increase in photocurrent generation using PhC microcavities. In addition, considerable advancement in waveguide TPA detectors has been demonstrated in CMOS for interconnect application.

SUMMARY

All combinations of the concepts discussed in below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

A photodetector includes a substrate and a polysilicon layer deposited on the substrate. The polysilicon layer is patterned to form a photonic crystal having a defect and a biatomic lattice surrounding the defect, to couple light from free space into a guided mode resonance of the defect. The photodetector further includes a p-doped region and an n-doped region, formed in the polysilicon layer, to apply an electric field across at least a portion of the biatomic lattice. The electric field sweeps free carriers generated by the light coupled from free space to the guided mode resonance. The photodetector further includes a first electrode, in electrical communication with the p-doped region, and a second electrode, in electrical communication with the n-doped region, to couple a photocurrent generated by the free carriers out of the polysilicon layer.

A photodetector includes a photonic crystal lattice including first lattice elements of a first size, second lattice elements of a second size that is larger than the first size, third lattice elements of a third size that is larger than the second size, and fourth lattice elements of a fourth size that is larger than the third size. The photonic crystal lattice defines a first zone including a point detect to receive an incident optical beam and to couple the incident optical beam to a resonant mode of the photonic crystal lattice. The photonic crystal lattice also defines a second zone surrounding the first zone and including the first lattice elements, and a second zone surrounding the first zone and including the first lattice elements. The photonic crystal lattice also defines a fourth zone surrounding the third zone and including the fourth lattice elements.

A focal plane array includes a set of photonic crystal lattices. Each photonic crystal lattice includes first lattice elements of a first size and second lattice elements of a second size larger than the first size. Each photonic crystal lattice defines a first zone with the first lattice elements, the first lattice elements defining a plurality of gamma points to receive an incident optical beam and to couple the incident optical beam to a resonant mode of the photonic crystal lattice. Each photonic crystal lattice also defines a second zone surrounding the first zone, wherein the second zone includes only second lattice elements.

A photodetector includes a biatomic two-dimensional (2D) photonic crystal having a first lattice constant, a second lattice constant larger than the first lattice constant, and a point defect defining a guided mode resonance of the biatomic 2D photonic crystal. The photodetector also includes a p-doped region and an n-doped region disposed on the biatomic 2D photonic crystal and configured for carrier collection from the point defect.

BRIEF DESCRIPTIONS OF THE DRAWINGS

The patent or application file contains at least one drawing executed in color. Copies of this patent or patent application publication with color drawing(s) will be provided by the Office upon request and payment of the necessary fee.

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 2A illustrates a single atomic lattice.

FIG. 2B illustrates a biatomic lattice.

FIG. 2C illustrates a unit cell for the lattice of FIG. 2A.

FIG. 2D illustrates unit cells for the lattice of FIG. 2B.

FIG. 5 illustrates an overview of NIR silicon based surface-illuminated detectors, and their various enhancement mechanisms. Noise equivalent power (NEP) estimates are based on shot-noise statistics of dark current and responsivity if not reported.

Figure 6:
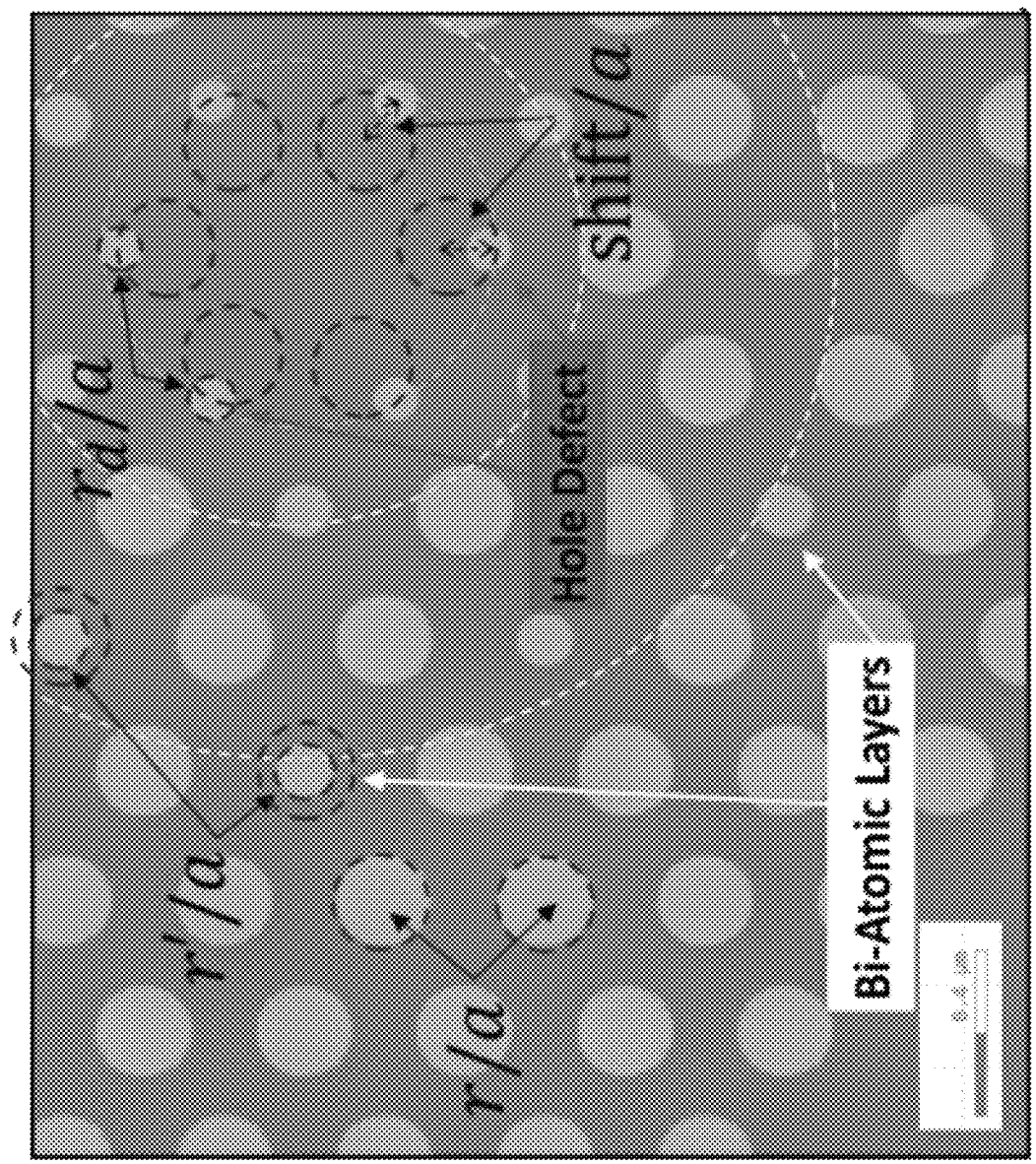
FIG. 6 shows design parameters for a PhC slabf.
Figure 8:
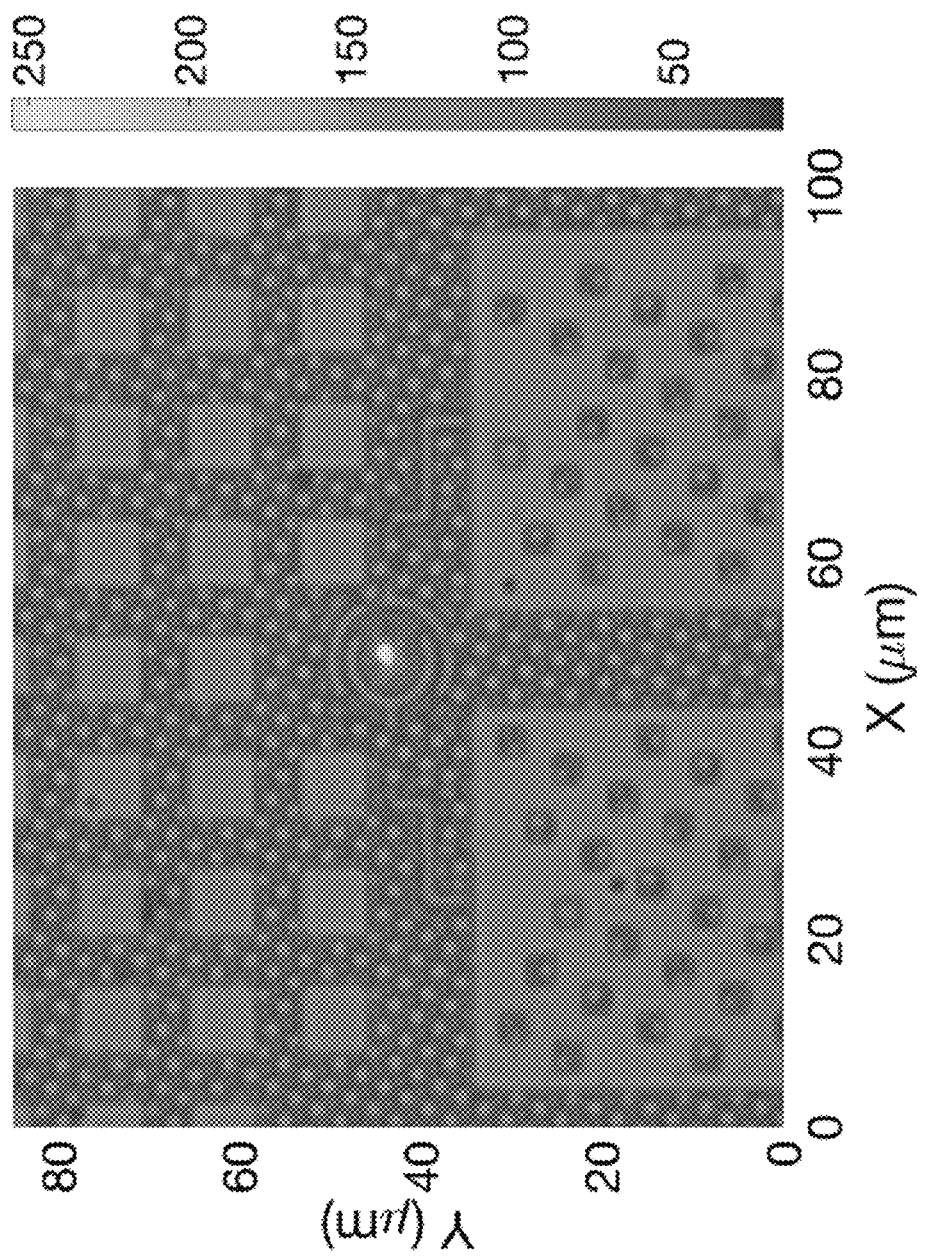

FIG. 8 illustrates an intensity bitmap (0-256) of the PhC slab of FIG. 6 collected from an InGaAs camera sensor/detector after alignment of the detector to a free-space laser beam. The axes are scaled to show distance (centered at an arbitrary location). A fine-coarse nob on the laser xy translation stage is used to increase the photocurrent.

Figure 9A:
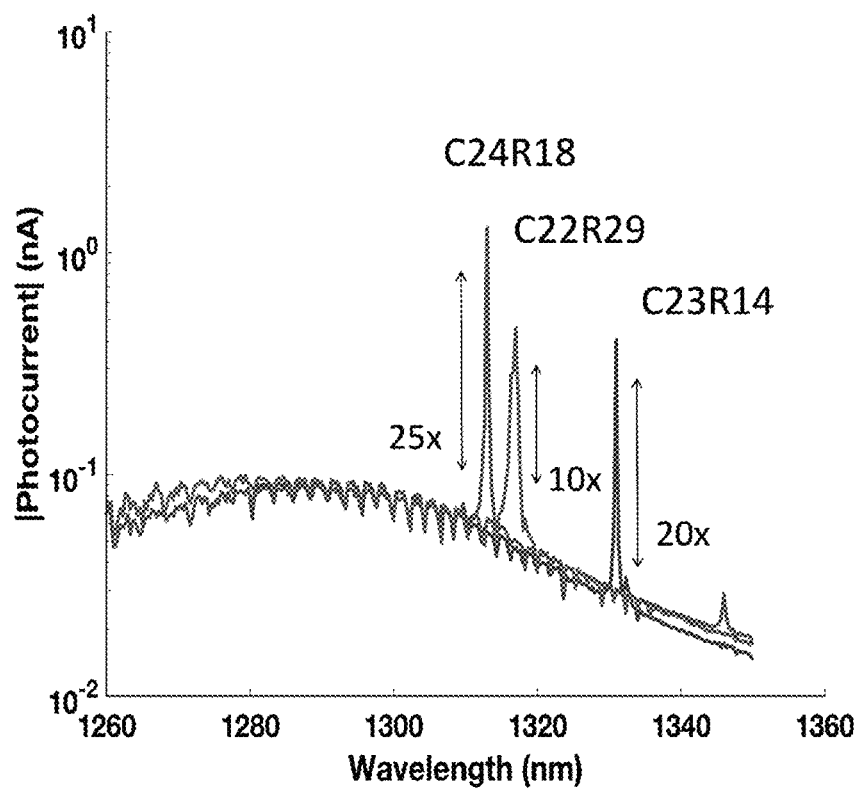

FIG. 9A illustrates spectral responses of devices/photodetectors C24R18, C22R29, and C23R14 and their respective extinction ratios. The quality factors of the devices in order are Q=6565, 1317, and 6655. The devices are named based on their location on the chip (where C corresponds to the device's column, and R to its row).

Figure 9B:
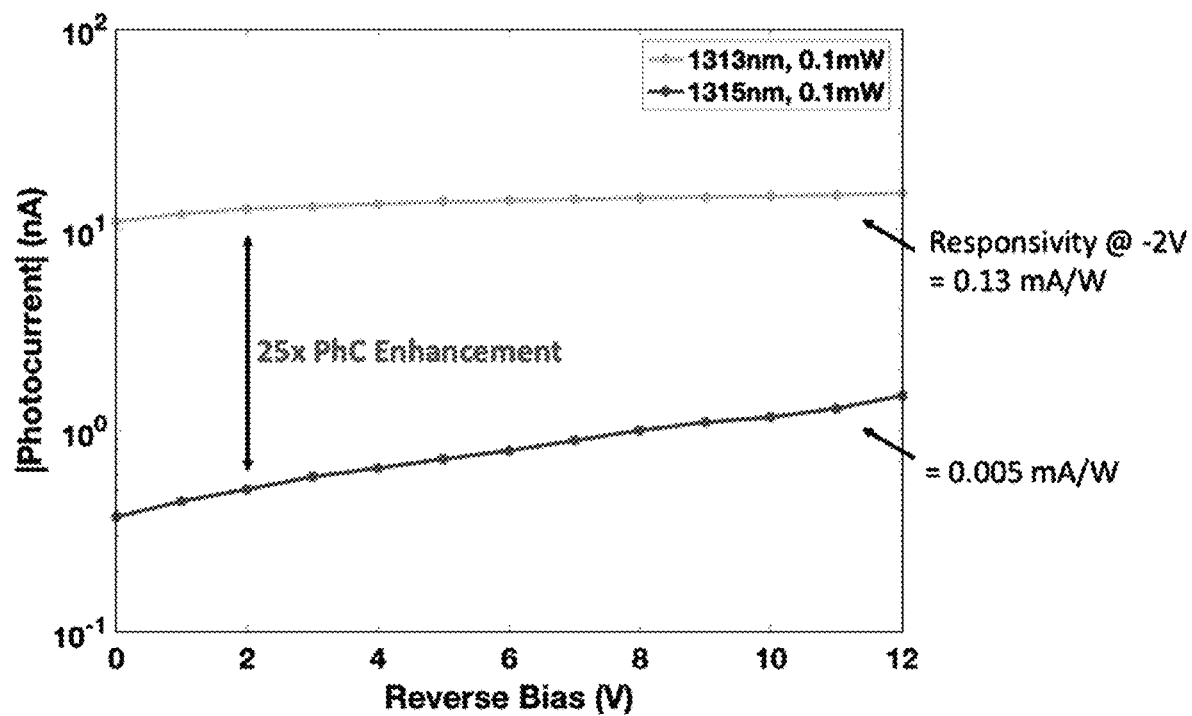

FIG. 9B illustrates an I-V graph of the C24R18 device of FIG. 9A, and particularly illustrates on and off-resonance in reverse bias.

Figure 10B:
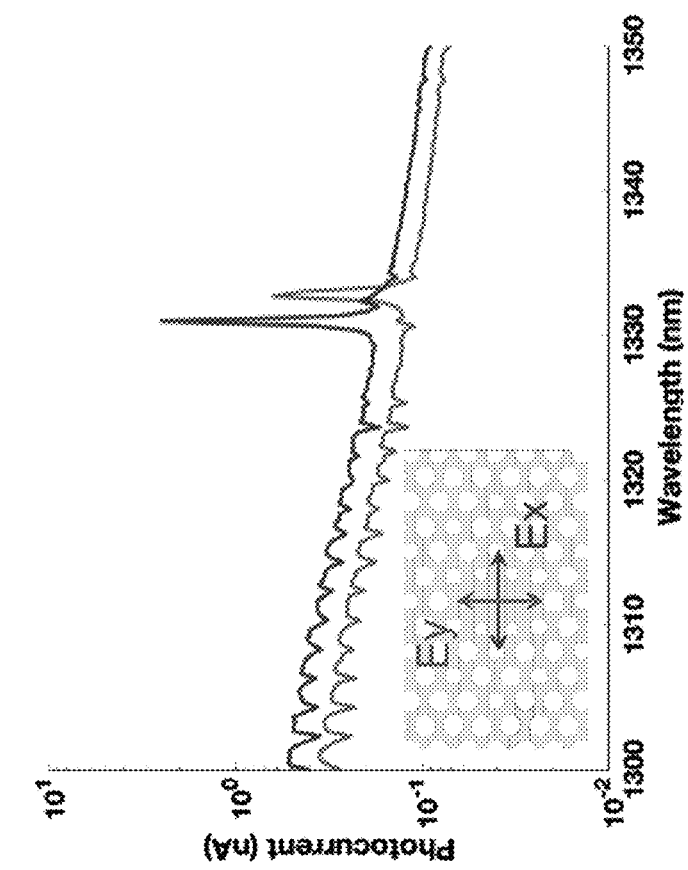
Figure 10A:
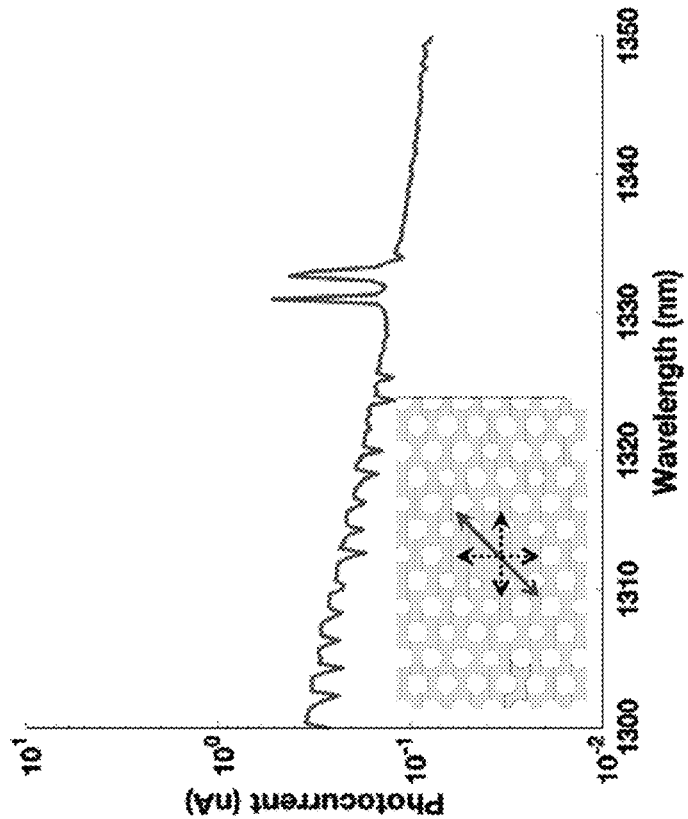

FIG. 10A illustrates the illumination of mixed polarization light and two perpendicularly polarized lights.

FIG. 10B illustrates the illumination of mixed polarization light and resonance shifts based on the 90° symmetry-break in the hexagonal structure and additional alterations in the structure of the defect.

Figure 11A:
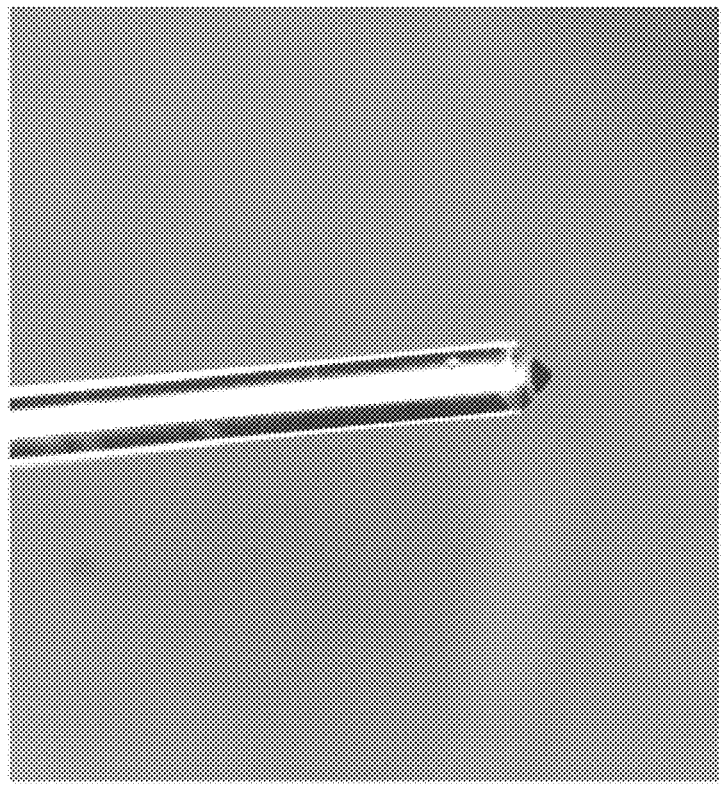

FIG. 11A illustrates an image of the tip of a lensed fiber for illuminating the photodetector C24R18.

Figure 11B:
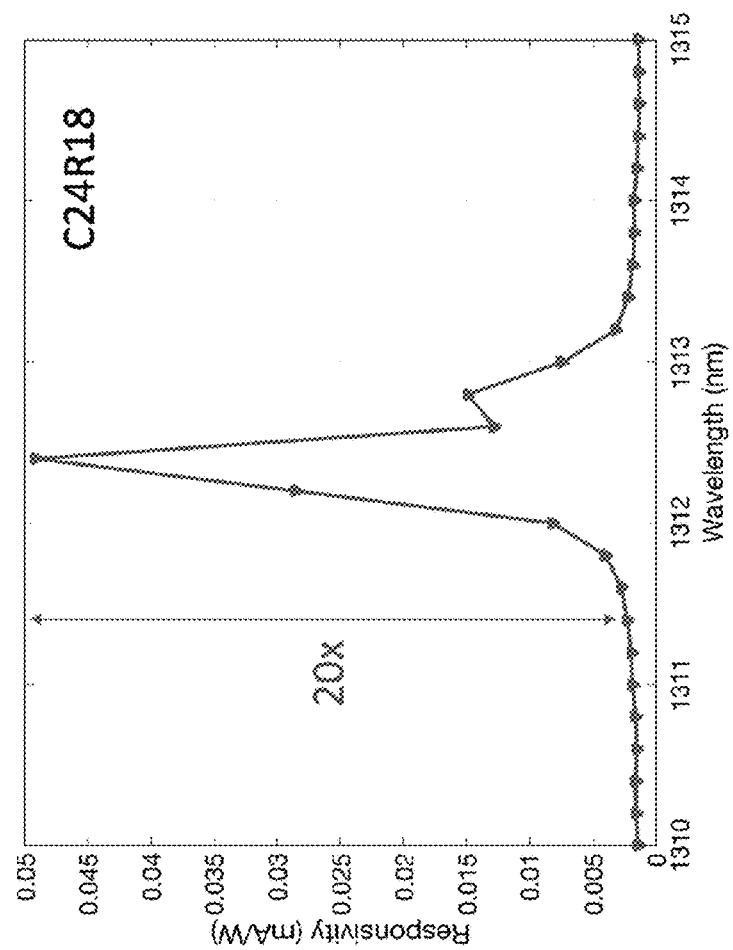

FIG. 11B illustrates a plot of the responsivity against wavelength for the photodetector C24R18. The input optical power is set to 0.9 mW with a set reverse bias of 2 V.

FIG. 12A illustrates a plot of the linear dynamic range (LDR) (40 dB) of the photodetector at a CW (continuous wave) and −2 V operating point.

FIG. 12B illustrates the spectral response of device C23R14 to illumination, at various distances away from the center of the cavity.

Figure 13:
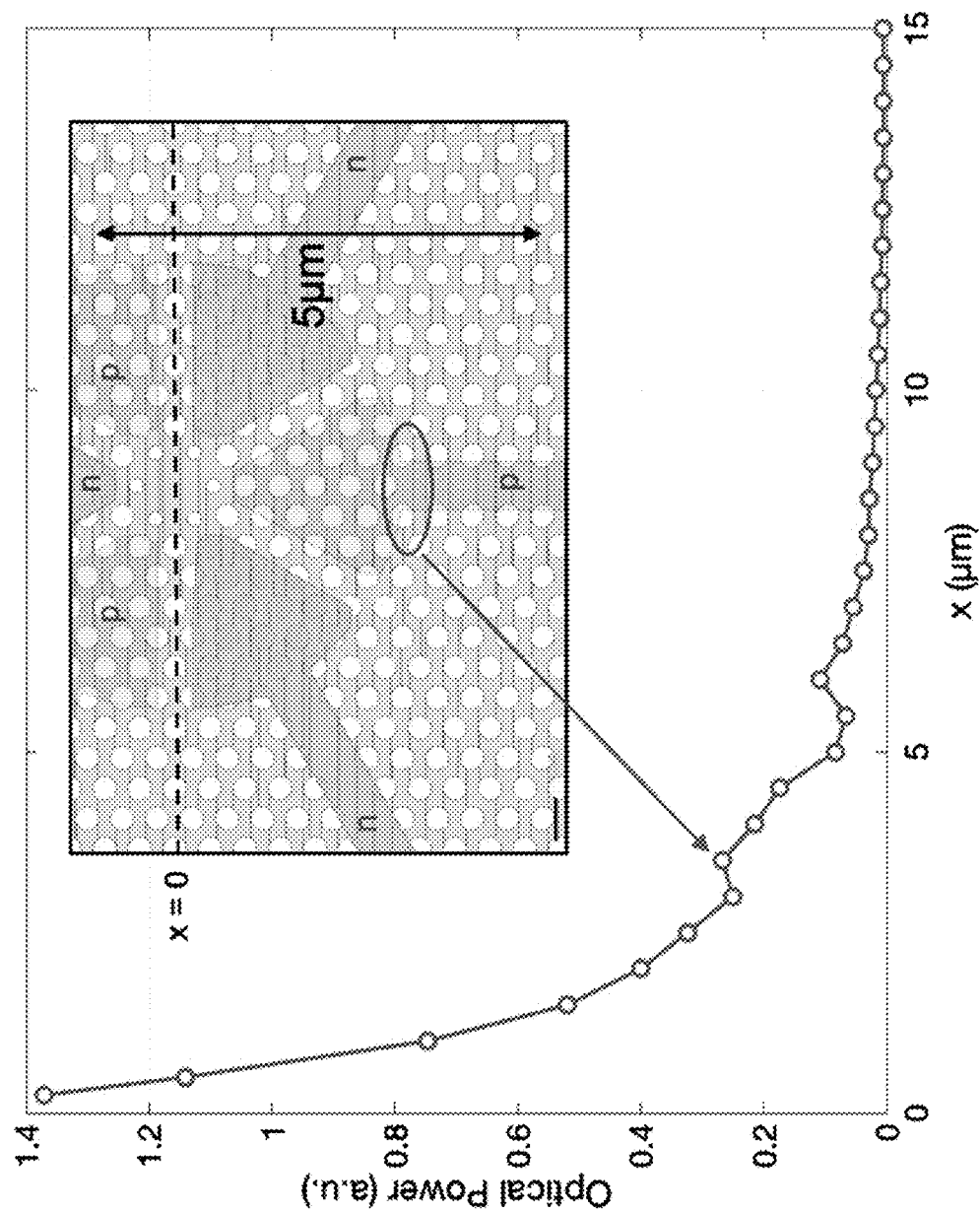

FIG. 13 illustrates a measurement of current plotted against fiber position, x, where x=0 is the center of the defect. A discontinuity in the current response is seen at the same distance as the discontinuity in crystal structure.

Figure 14B:
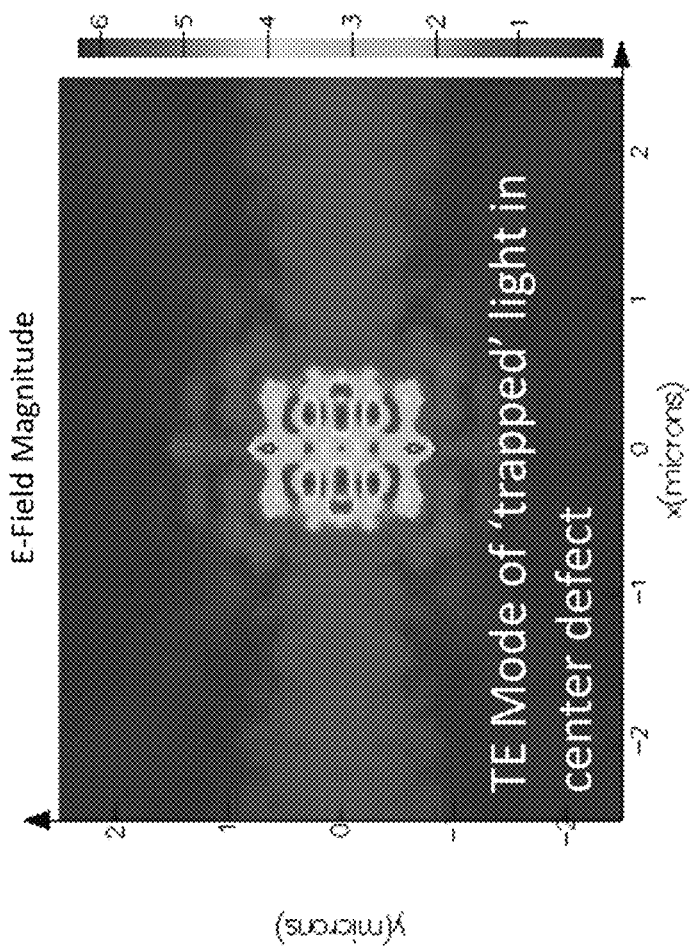
Figure 14A:
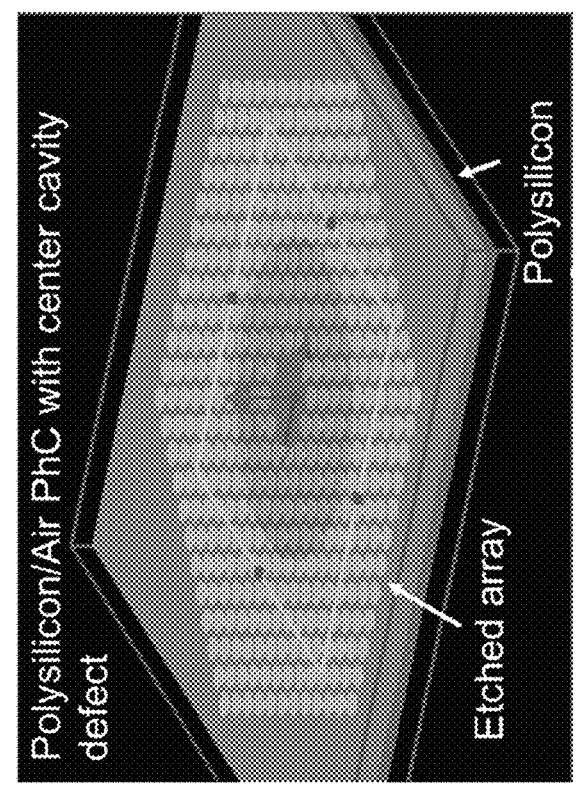

FIG. 14A illustrates a simulated photonic crystal (PhC) cavity in Lumerical. The PhC cavity structure is made to visualize modes and field intensity. Fabrication materials used to construct the PhC cavity include polysilicon and air with indices 3.5 and 1, respectively.

FIG. 14B illustrates a simulated PhC cavity in Lumerical. The color bar showing the magnitude of $E/E_{Norm}$. C23R14 PhCC structure is used as the basis for the simulation.

FIG. 15A illustrates calculated band structure (4 bands) in MPB (Massachusetts Institute of Technology (MIT) Photonic Band package) for both TE and TM modes. The shaded regions show the photonic bandgap for (red) TE and (blue) TM modes. The geometry is defined to be an infinite triangular PhC with a=0.4 µm and r=0.33a.

FIG. 15B illustrates a Finite-Difference simulation used on a C23R14 photonic crystal (with $n_{polySi}$=3.5 and $N_{so2}$=1.5) to determine resonance strength and coupling. The source is modeled as a Gaussian current point-source centered at 1330 nm with σ=300 nm with $H_y$ polarized.

FIG. 15C illustrates a Finite-Difference simulation used on a C23R14 photonic crystal (with $n_{polySi}$=3.5 and $N_{so2}$=1.5) to determine resonance strength and coupling. The source is modeled as a Gaussian current point-source centered at 1330 nm with σ=300 nm with $H_x$ polarized.

Figure 16A:
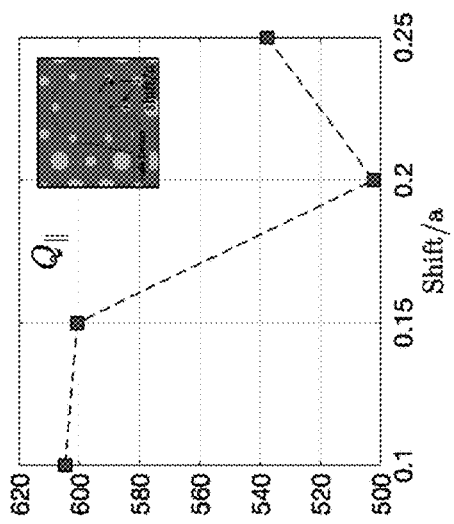

FIG. 16A illustrates an 2D MIT Electromagnetic Equation Propagation (MEEP) transmission calculation of four PhC cavities (PhCCs) with different defect shifts based on the C23R14 parameters. A closeup of the cavity resonance is shown on the bottom right corner with the corresponding shift values.

Figure 16B:
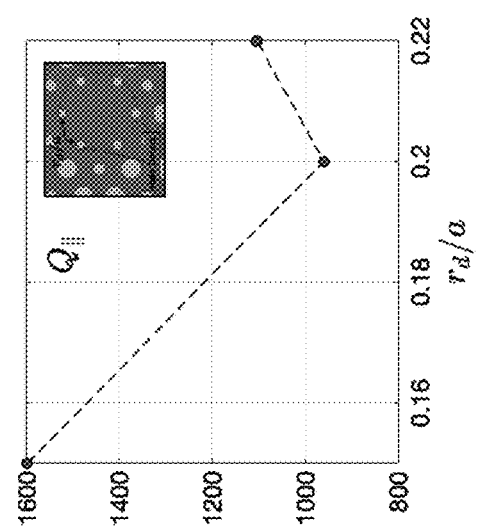

FIG. 16B illustrates the quality factor as function of normalized shift parameter ($r_d$/a=0.2).

Figure 16C:
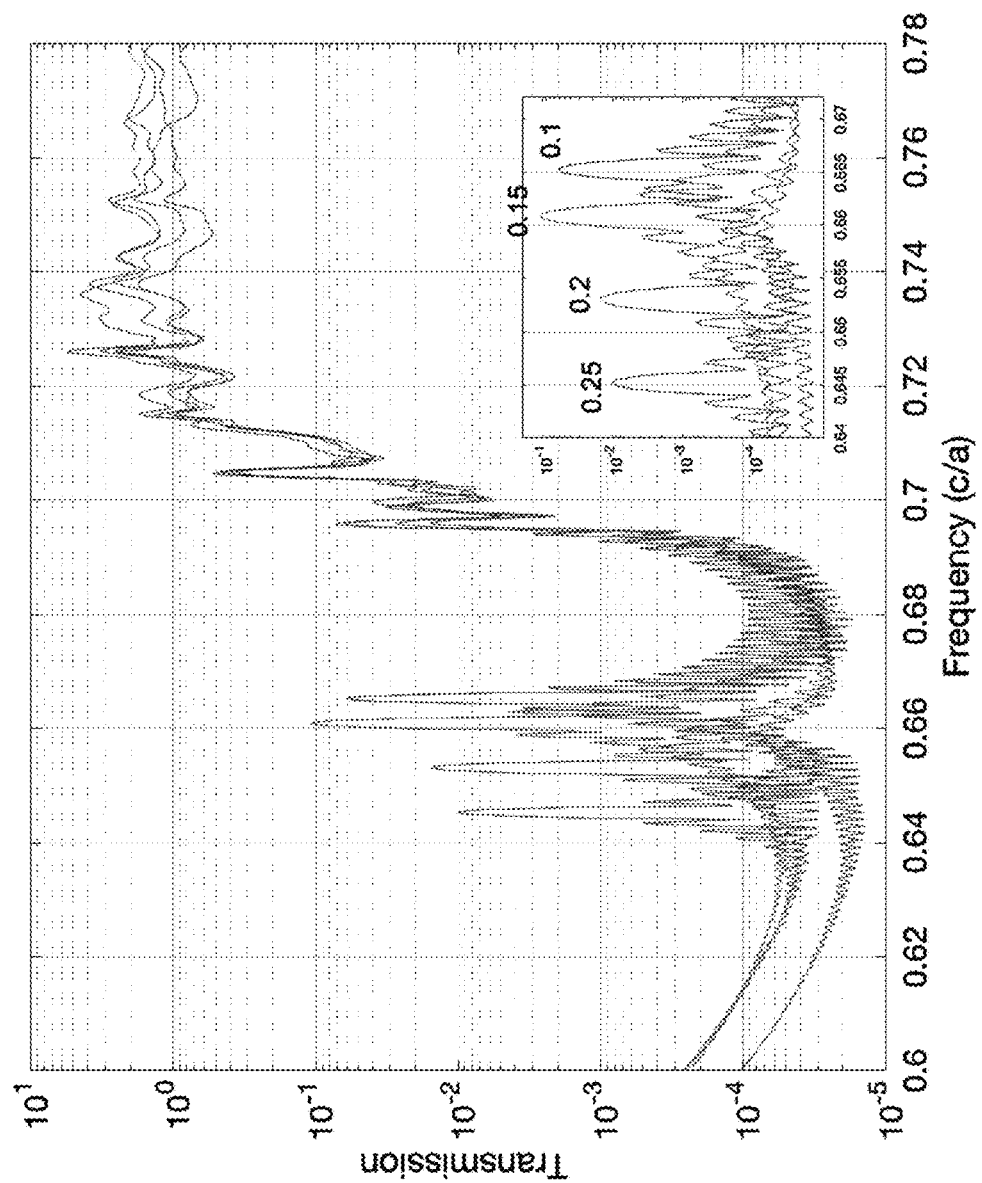

FIG. 16C illustrates the quality factor as a function of the normalized defect resizing with shift/a=0, and all other parameters held constant.

Figure 17:
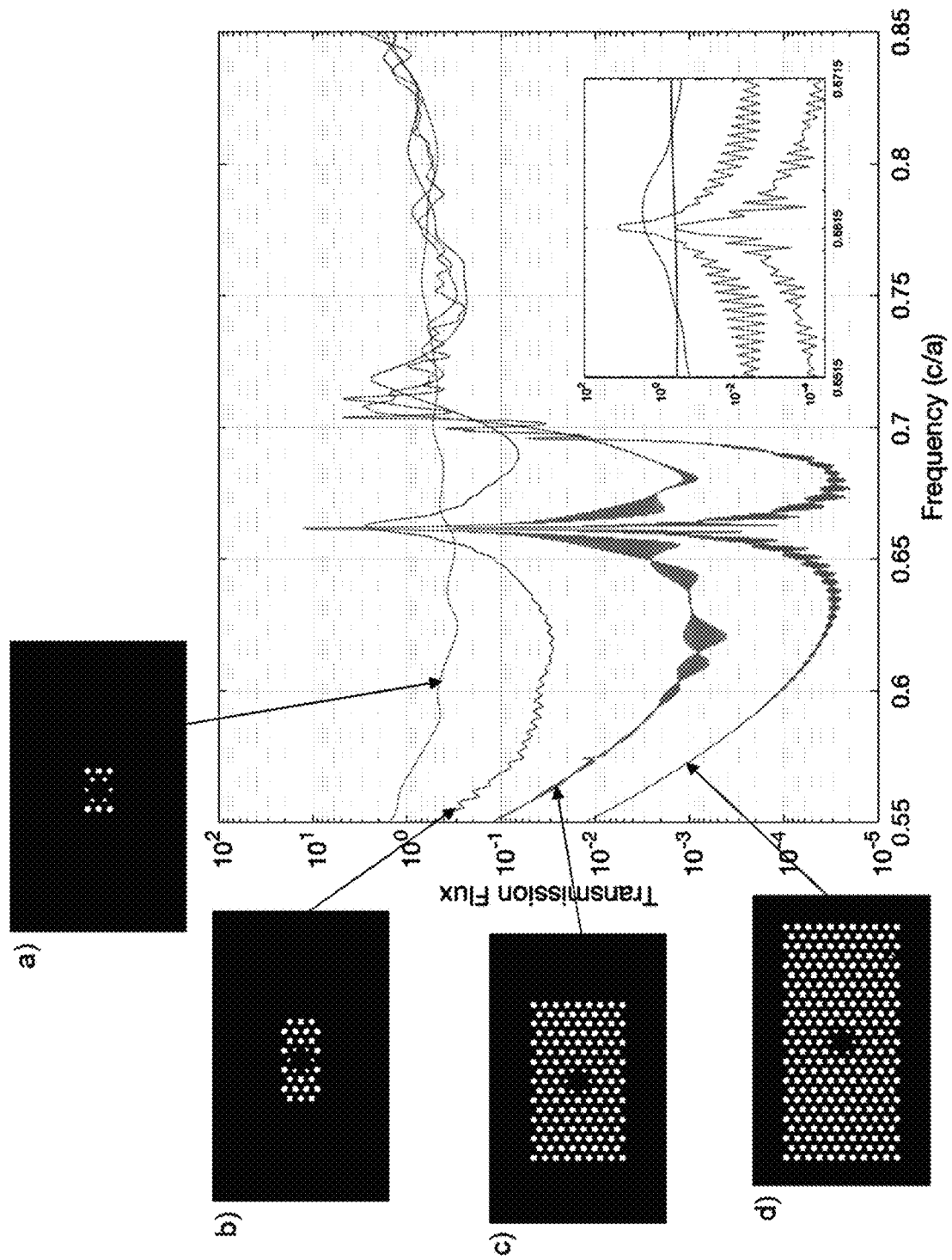

FIG. 17 illustrates the in-plane (2D) transmission of four different PhC slab sizes with the same identical cavity (C23R14) implemented in MEEP. Panels a-d illustrate triangular PhCC lattices with sizes 5×5 (panel a), 9×9 (panel b), 20×20 (Q=1102)(panel c), and 30×30 (Q=1655)(panel d).

Figure 18:
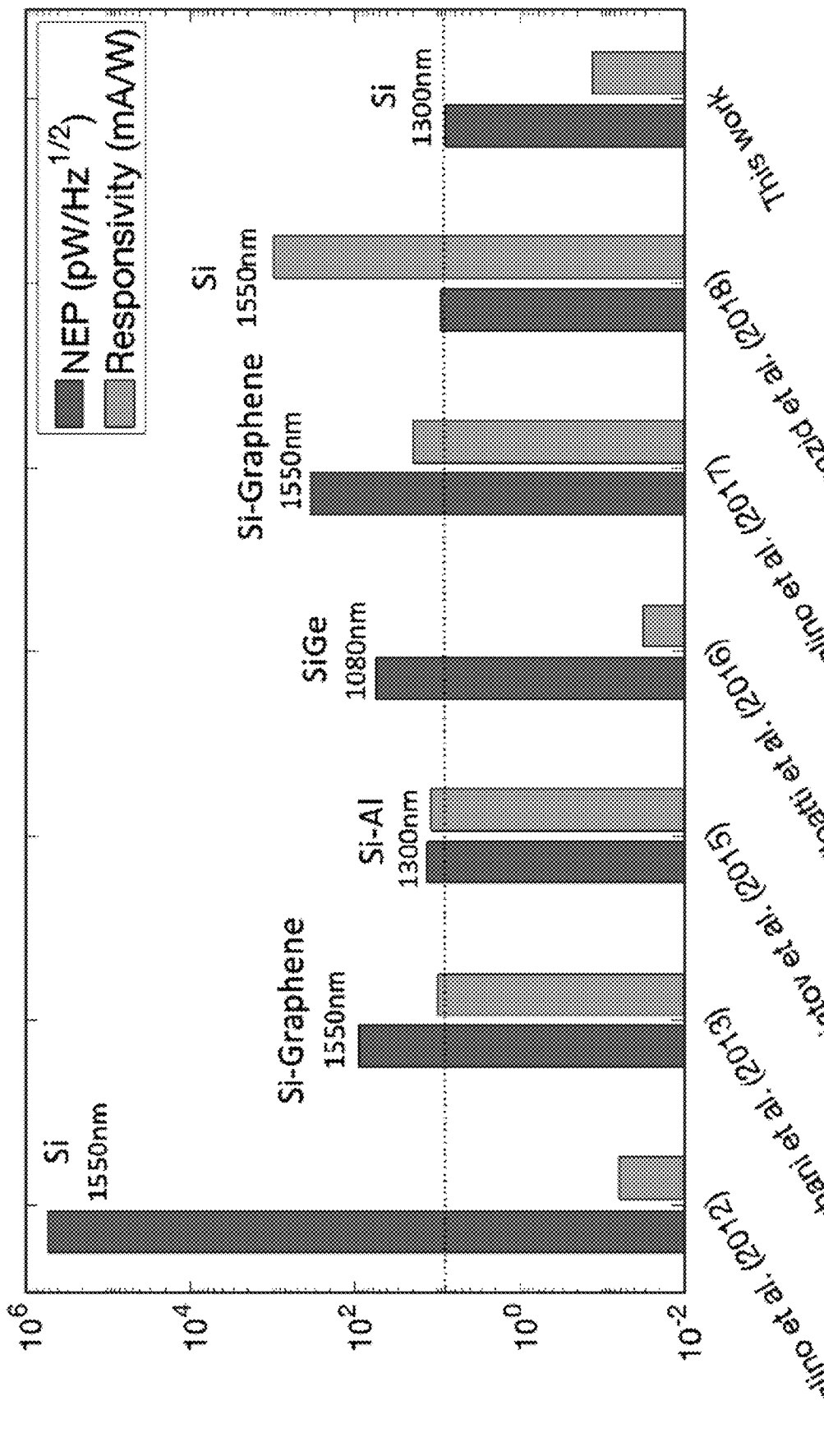

FIG. 18 illustrates a comparison of different infrared silicon detectors in the literature showing their estimated NEPs, based on the dark current and responsivities at given biases.

Figure 19:
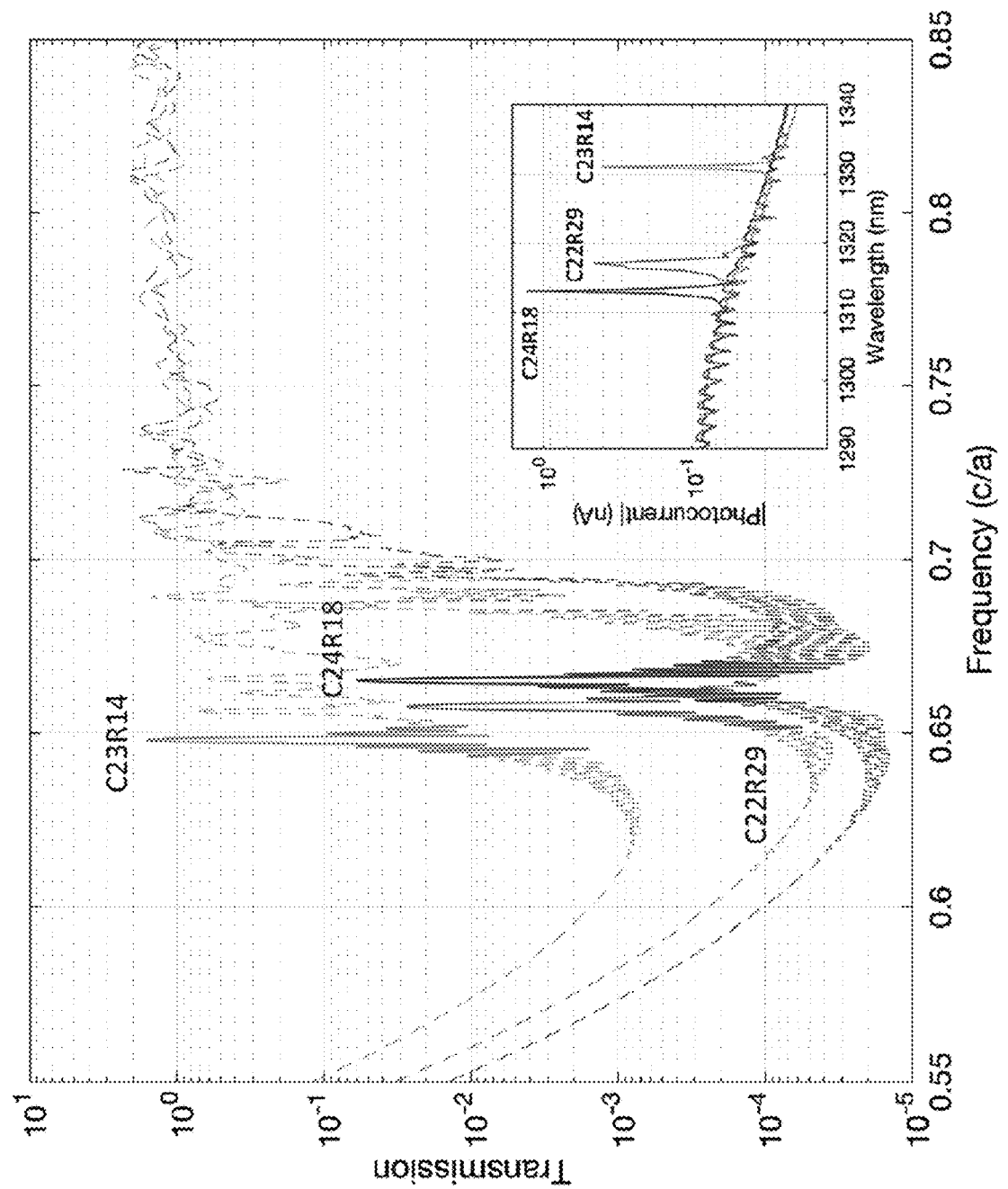

FIG. 19 illustrates a trend comparison between experimental and simulation results for the best preforming devices in Table 2. The speed of light, c, is set to unity, thus the frequency, f, is related to the wavelength, λ, through f=1/λ.

Figure 20:
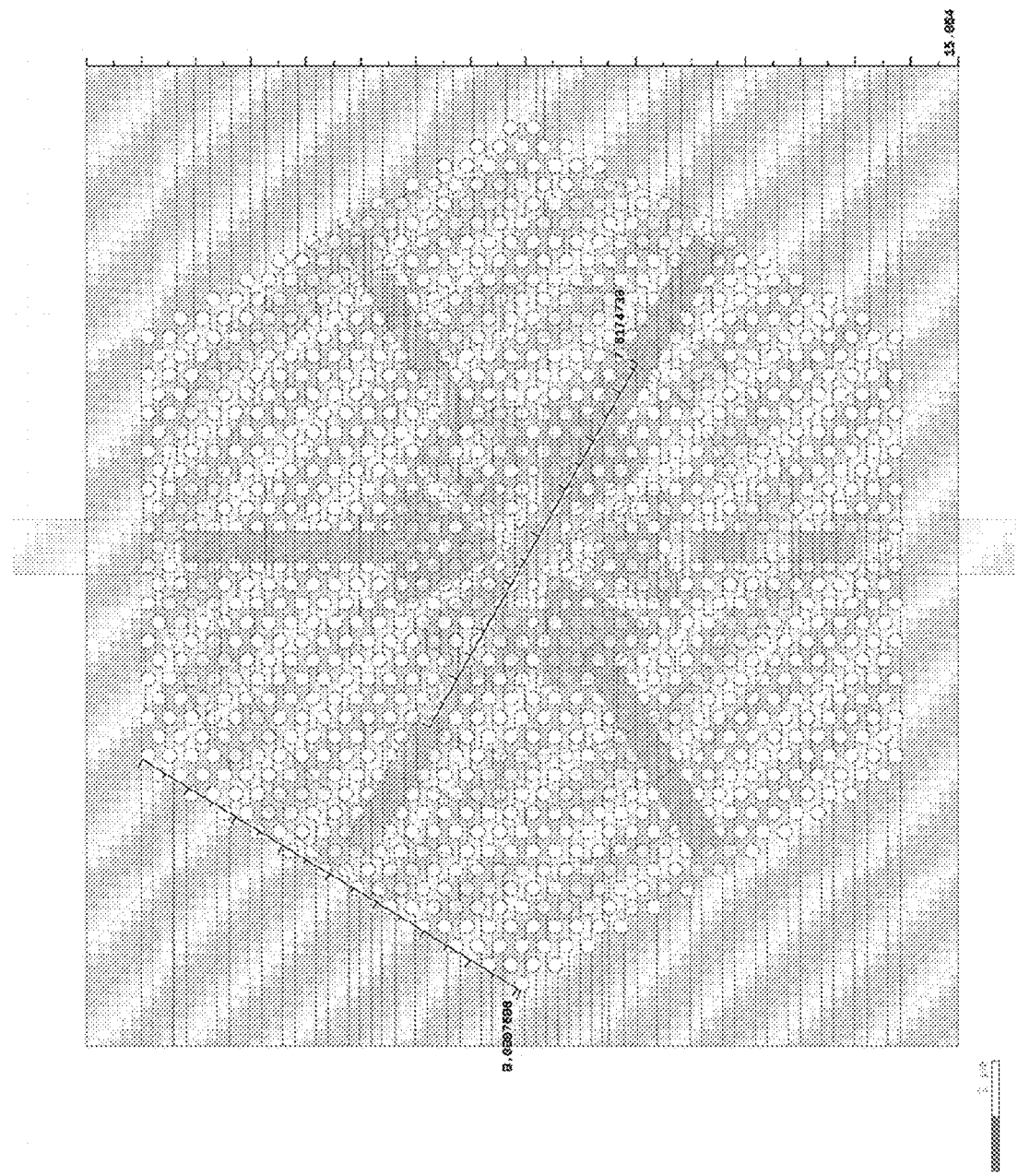

FIG. 20 illustrates the layout of a typical photodetector (device0 with annotated dimensions and scale. The pink (square) layer is the photonic crystal made of 220 nm think foundry-grade (low defect density) intrinsic poly-silicon. Cyan and brown (rail) regions are p-doped and n-doped polysilicon, respectively, to create the photodiode junction. The shape was chosen to increase the minority-carrier diffusion length into a nearby intrinsic region while maintaining low breakdown voltages and noise current. The doped regions were connected to the A1 circular regions through three vias each. The metal regions ultimately terminate at the landing pads used to probe the device. The pitch between the pads is 20 μm hence a 50 μm pitch ground-signal (GS) probe was used.

Figure 21:
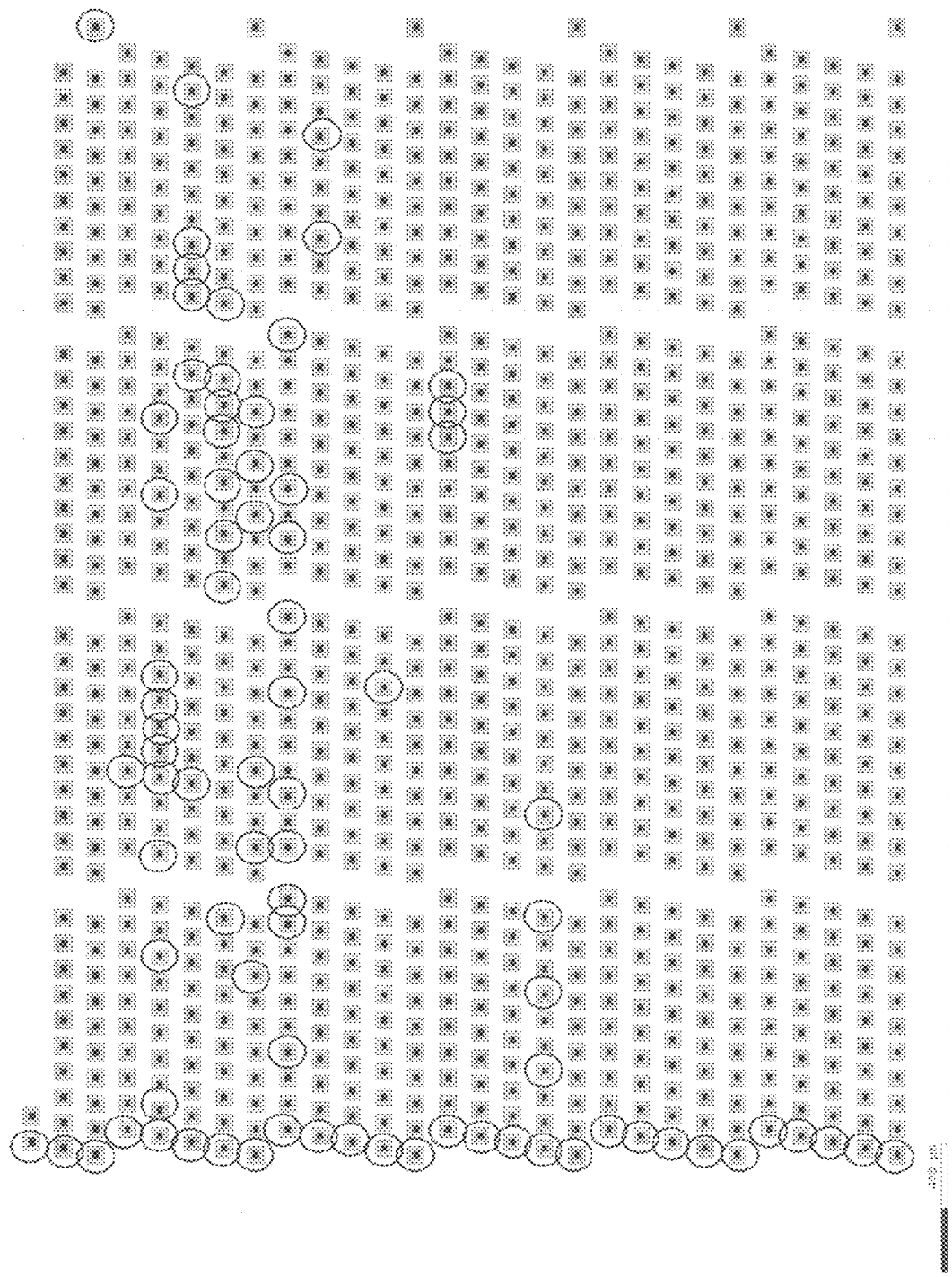

FIG. 21 illustrates the layout of parameter search space of 1088 PhCC devices used to narrow down highest performing devices. Circled devices were tested and characterized (+150 devices). Most devices exhibited limited-to-no spectral responses. These devices were chosen (excluded) based on the parameter-space nearest-neighbor performance and those which show positive (negative) correlation with the presence strong resonance. Among the excluded devices are all those with lattice constants of a=0.37 μm and a=0.43 μm, and those with 0.0 μm PN spacing (+750 devices).

Figure 22:
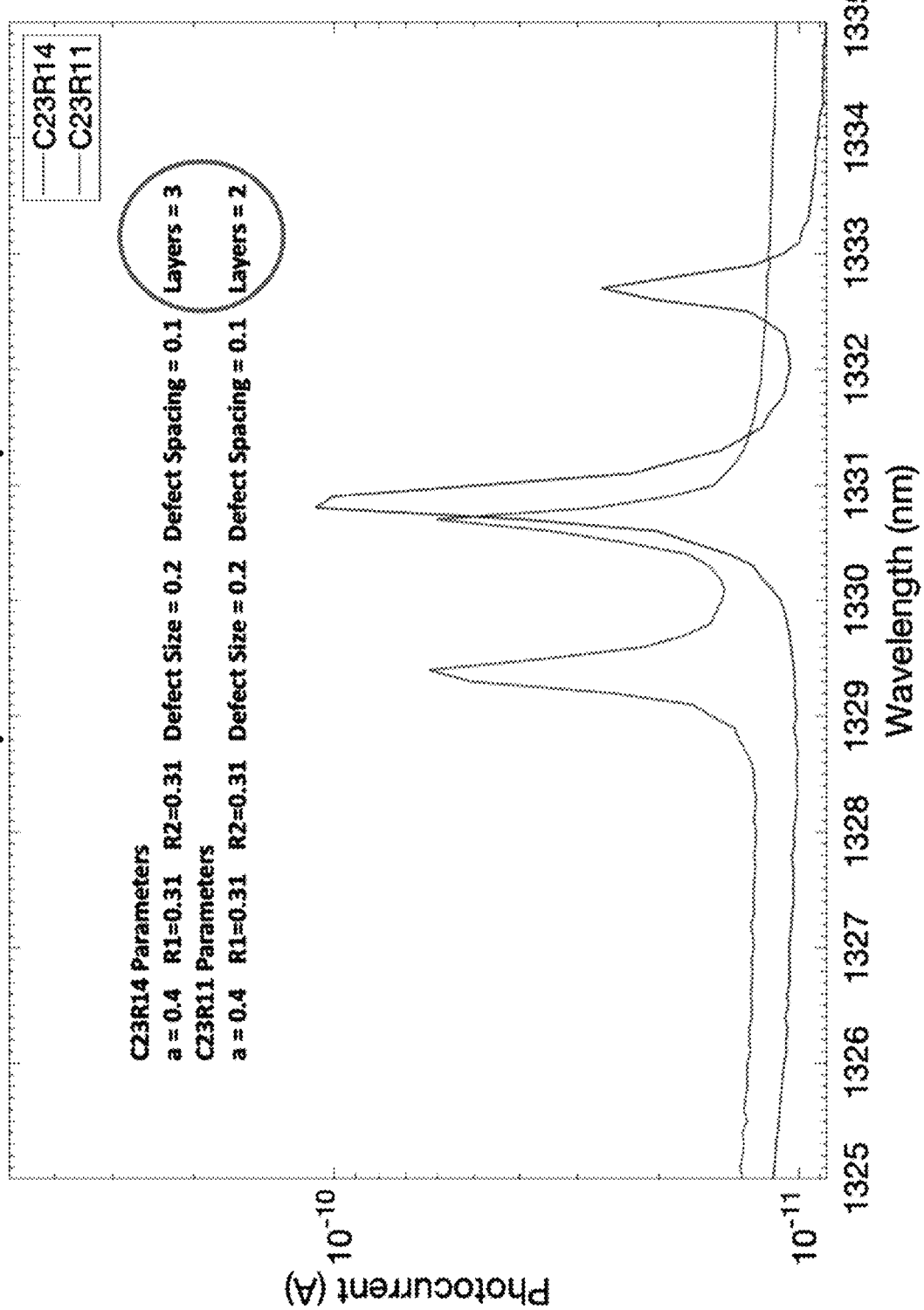

FIG. 22 illustrates two spectra corresponding to devices C23R11 and C23R14. The two devices have identical parameters except for the biatomic layer parameter (circled).

DETAILED DESCRIPTION

Theory of Operation—Introduction to Photonic Crystal Cavities

There are a number of ways to enhance light absorption and one of the main methods is by implementing a light confining structure. Examples of structures include Fabry-Perot resonators and rough surfaces (or more elegant, pyramid structures). However, most, if not all, designs cannot be efficiently integrated into the CMOS environment. The search for a small footprint detector, compatible with CMOS, led to a type of in-plane resonating structures termed photonic crystal cavities.

A structure with a periodic dielectric function is termed a photonic crystal. 1D, 2D, and 3D photonic crystals have periodicities in one, two, and three dimensions, respectively. This leads to interesting light propagation properties. Assuming separable spatial and temporal dependencies of the electric and magnetic field propagating in the medium, Maxwell's equations (neglecting electric and current source terms) can be rewritten as an eigenvalue equation, $$\nabla \times \left(\frac{1}{\epsilon(r)} \nabla \times \hat{H}(r)\right) = \left(\frac{\omega}{c}\right)^2 \hat{H}(r). \quad (1.1)$$

The eigenvalue in this case is $$\left(\frac{\omega}{c}\right)^2,$$

a real quantity. Hence, this complicated operator is Hermitian and analogous to the Hamiltonian operator in quantum mechanics. This equation holds all the information needed to describe light propagation in a varying dielectric medium.

In the case where ∈(r) is periodic, solutions to this eigenvalue problem become more manageable. Under periodic conditions, solutions should take the same periodicity as its environment. This is known as Bloch's Theorem. Applying it to the equation above, $$H_k(r) = e^{ik \cdot r} u_k(r) \quad (1.2)$$

where $u_k(r)$ is periodic with the same period of the dielectric function, i.e. $u_k(r) = u_k(r+R)$. For some dielectric function, a mode can have any arbitrary shape within a unit cell.

Photonic Band Gap and Defect States

Figure 4B:
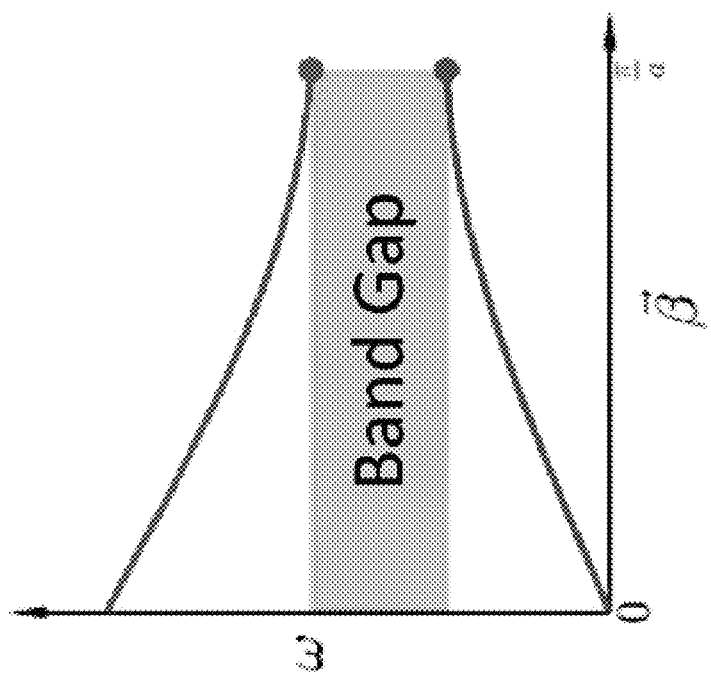
FIG. 4B illustrates wavelength separation of the two modes of FIG. 4A.
Figure 4A:
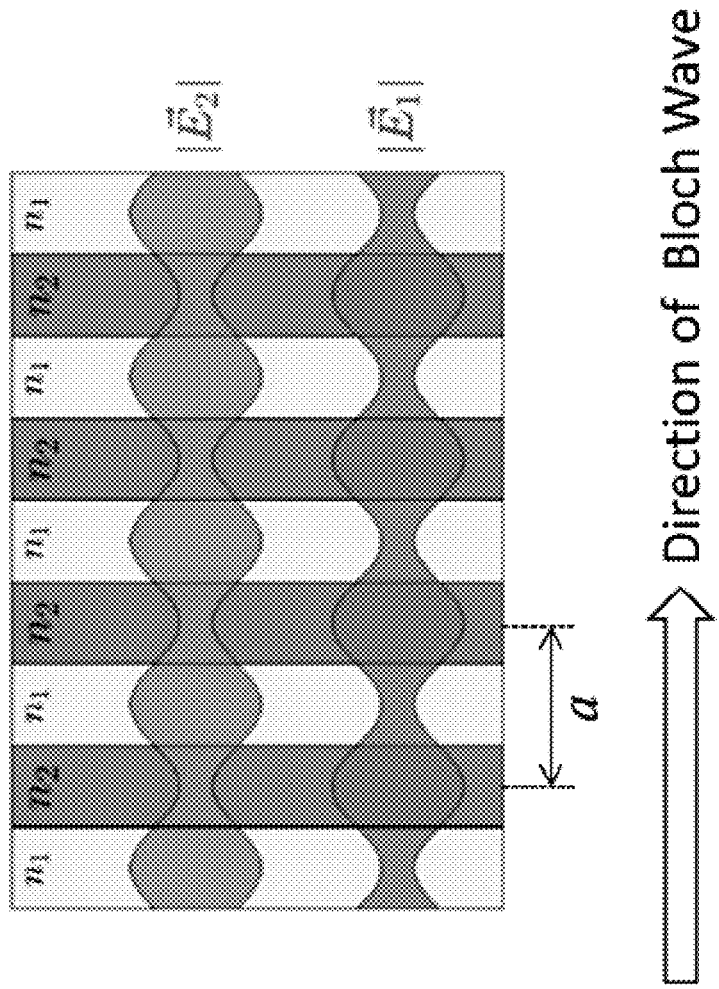
FIG. 4A illustrates two different modes propagating in a periodic dielectric medium.

Equation 1.2's periodicity leads to one of the most defining features of a photonic crystal: its bandgap. Due to the symmetry of the structure, the modes of the propagating wave should be at the center of either the low-index or the high index regions. This is illustrated in FIGS. 4A and 4B. Given these two modes, most of the energy of the wave then is localized either in the high index region, corresponding to a node in the center of the low-index region, or in the low index region, corresponding to a node in the center of the high-index region. The two modes of this structure have the same periodicity, but one is in a higher index region than the other. Two waves with equal wavevectors that propagate in different media carry different energies (i.e., they have different frequencies). This can be visualized by a jump in frequency between the two modes. This jump is illustrated in FIGS. 4A and 4B.

Modes that propagate in the high-index region are said to be propagating in the Dielectric Band, whereas modes that propagate in the low-index region are said to be propagating in the Air Band. In between is a gap where no modes exist. The gap is called a photonic bandgap.

Furthermore, introducing a defect to this perfectly periodic structure, such as a change in the index of one unit cell or the spacing between two unit cell boundaries, has interesting consequences. Due to this symmetry breaking, the area near this change will allow for modes to propagate within the bandgap. There will be a defect state that exists while completely surrounded by forbidden regions. Depending on the nature of the crystal and defect, the mode can be strongly localized in one, two, or three dimensions in a very selective wavelength.

This idea has been the basis of many important highly localized, highly selective, devices such as phase-modulators, VCSELs, and cavity electrodynamics. Here, the application of photonic crystal cavities is extended to the area of photodetectors, including free-space NIR detectors.

Polysilicon Resonant Infrared Detectors

Polysilicon is a material that absorbs light at infrared wavelengths through its mid-gap defect states. Polysilicon is also compatible with silicon processing and is commonly used for the gate contact of field-effect transistors in CMOS. While optical absorption is weak in polysilicon, resonant optical structures in polysilicon films can enhance the quantum efficiency of polysilicon detectors to above 20%. The small mode-volume of these resonant detectors allows reducing the junction area, and hence the detector dark current. Dark currents below 100 pA have been achieved in polysilicon resonant detectors. However, to date, the use of polysilicon in resonant detectors has been mostly limited to in-plane micro-ring resonators. Such resonant detectors are not ideal for surface illumination as they require a separate coupling mechanism (e.g., a diffraction grating) for receiving and emitting light. The extra space taken up by this coupling mechanism limits the fill factor and minimum pixel pitch when building detector arrays and imagers.

Another class of resonators that could enhance the absorption of polysilicon film is based on photonic crystal structures. A one-dimensional (1D) or two dimensional (2D) array of periodic features etched into the polysilicon film can provide both an in-plane resonance and coupling to the out-of-plane illumination, all in one structure. This can allow for building detector arrays and imagers in polysilicon films with high fill-factors and small pixel pitches. Without being limited by any theory in particular, and as described here, at least two different designs and electromagnetic phenomena can be used to implement these photonic crystal resonant detectors: 1) using the first stop-band of the photonic bandgap structure, and 2) using the second stop-band of the photonic bandgap structure.

The first stop-band of a photonic crystal provides an in-plane photonic bandgap that can be used to design an in-plane resonator by implementing a defect in the photonic crystal structure. This optical defect mode is confined in all directions in the plane of the slab by the photonic bandgap structure. The coupling of the resonance (or defect) mode to out-of-plane radiation can be adjusted by the design of the defect. Through proper engineering, the out-of-plane illumination could couple efficiently into the in-plane resonance mode. This excites the resonant mode of the detector and enhances the absorption of the illumination field.

The second stop-band of a photonic crystal structure (Gamma point in the Brillouin zone) is leaky and therefore is coupled to the out-of-plane radiation. Proper engineering of the photonic crystal structure can provide an in-plane resonance through the second-order grating effect in the photonic crystal. The leaky mode that also exhibits in-plane resonance is known as, and sometimes referred to here as, a guided-mode resonance (GMR). By implementing a GMR in a polysilicon film, absorption of the illumination field can be enhanced through the resonance effect.

Photodetectors based on each of these designs are explained below in turn.

Biatomic Photodetector Design

FIGS. 2A and 2B illustrates a single-atomic triangular lattice photonic crystal (PhC) 200 and a biatomic triangular lattice PhC 200', respectively. The PhC 200 and/or the PhC 200' can be composed of any suitable material(s) such as a periodic dielectric, a metallo-dielectric, superconducting microstructure/nanostructure, and/or the like. Example materials for the PhC 200 and/or the PhC 200' include polysilicon, doped silicon, germanium, combinations thereof, and/or the like. As an example, for polysilicon, the periodicity of the PhC 200 and/or the PhC 200' can be about 450 nm, and the band gap can be about 1.12 eV. The PhC 200 and the PhC 200' are illustrated as triangular lattices, but may be square lattices instead.

Referring to FIG. 2A, the PhC 200 includes lattice elements 220, which can be rods, holes, laid out in a Yablonovite structure, and/or the like. An expanded portion 210 of the PhC 200 shows the elements 220 in more detail, and also shows a unit cell 230 of the PhC 200, which includes a single lattice element 220. FIG. 2C shows a reciprocal lattice of the PhC 200. A point-defect cavity mode (e.g., made by removing one hole or rod from the PhC 200) of the reciprocal lattice has plane-wave components at the M symmetry points, shown by the dots 240.

Now referring to FIG. 2B, the biatomic PhC 200' includes lattice elements 220a, 220b of difference sizes. The PhC 200' can be a square lattice, a hexagonal lattice, a triangular lattice, and/or the like, and the lattice elements themselves can be of any suitable shape (e.g., rectangular, square, triangular, ellipse/elliptical, etc.). The lattice constant of the PhC 200' can be from about 300 nm to about 600 nm, including all values and sub-ranges in between. The radius of the lattice elements can be from about 0.1 times to about 0.45 times the lattice constant.

The expanded portion 210' of the PhC 200' shows a unit cell 230', which now includes the lattice element 220b at its center, and the lattice element 220a at its edges. In the biatomic design of FIG. 2B, the plane waves of the cavity mode (of the PhC 200') can couple to other high symmetry points. The resulting, new high symmetry points 240' in the biatomic design of the PhC 200' are illustrated by the smaller hexagons 250 in FIG. 2D. One of the new high symmetry points that the cavity mode can couple to is the Gamma point 260 (also shown by the arrow in FIG. 2D). So one consequence of perturbing the single-atomic lattice of FIG. 2A to be biatomic is to couple light from the cavity mode that is highly concentrated around the M symmetry points 240' to the cavity mode that contains considerable electromagnetic energy around the Gamma point 260. The Gamma point cavity mode can be characterized as a plane wave radiating normal out of the plane of the photonic crystal. By tuning the strength of the coupling of this perturbation, as described below, to the out-of-plane mode, one can achieve critical coupling to the cavity mode for high quantum efficiency.

The PhC 200' is useful for forming efficient resonant photodetectors exhibiting precise control for the coupling of the detector to free-space illumination, as explained first for a 1D biatomic design (see FIG. 2E), and then the 2D biatomic design of the PhC 200'. Generally, the extent of such coupling can be roughly proportional to the absorption of the detector material; the stronger the absorption, the stronger the coupling. This condition, known as the critical coupling condition, balances the rate of absorption (also sometimes referred to as the absorption coefficient) with the rate of free-space coupling. In practice, the rate of absorption (which is based on the materials of the PhC 200') and the rate of free-space couple can be engineered to be about the same.

The absorption coefficient of the photodetector can depend on the material of the photodetector, on conditions related to growth and/or deposition of the material such as, for example the temperature, and/or the like. For a material such as polysilicon, and accordingly for photodetectors based on polysilicon, the absorption coefficient of the photodetector can vary by a factor of 2 to 5, depending on deposition conditions. This makes desirable a flexible design approach that permits tuning of the coupling of the resonance mode (e.g., around the symmetry points 240') to a free-space mode (e.g., to the Gamma point 260) to achieve coupling for optimal or critical coupling operation.

Figure 2E:
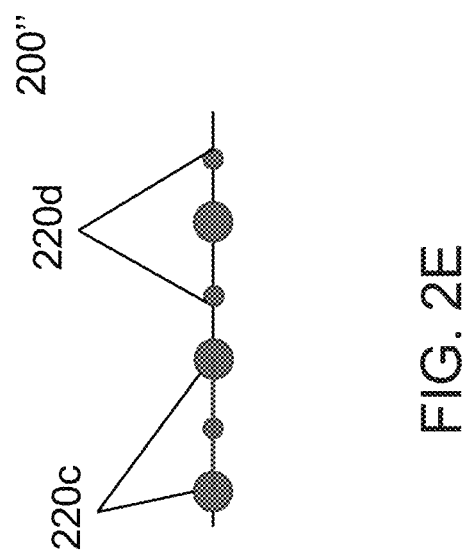
FIG. 2E illustrates a 1-dimensional (1D) biatomic lattice.

Creating a one-dimensional bi-periodic/biatomic structure along the axis/dimension of a 1D PhC provides an efficient design to tuning such coupling of free-space illumination. FIG. 2E illustrates a 1D biatomic PhC 200'' that includes differently sized and/or shaped lattice elements 220c and 220d. Such a design couples an in-plane lattice standing wave to a free-space plane wave propagating normal to the surface of the PhC 200'' through the bi-periodic grating structure of the PhC. As a result, the cavity mode of the PhC is coupled to the Gamma point (not shown). By adjusting the strength of perturbation of the bi-periodic structure, such as by varying the difference between the sizes of the lattice elements 220c and 220d, varying the shapes of the lattice elements, or both, coupling to the free-space mode can be controlled. This technique is extendible to 2D (e.g., L3) PhC cavities, such as the PhC 200'.

The bi-periodic PhC cavity design can then be generalized from 1D PhCs (FIG. 2E) to 2D PhCs by using a 2-atomic PhC lattice. The symmetry of the biatomic design causes coupling of the cavity modes at the M symmetry points 240 in an otherwise single-atomic lattice (see FIG. 2C) to the Gamma point 260 of the biatomic lattice (see FIG. 2D). The Gamma point 260 is above the light-line as defined by the dispersion characteristics of the PhC, and which in turn defines which modes are confined to the lattice and which ones can radiate/couple into free-space. Modes above the light line, such as the Gamma point 260, are couplable to free-space and/or out-of-plane modes. Changing the relative size or shape of the two lattice elements (e.g., holes) in the biatomic crystal can change the strength of coupling of the resonance mode to the free-space mode. As an example of relative size, the size of each of the lattice elements can be any size between zero and half of the lattice constant. As an example, if a is the lattice constant, one lattice element can have the size 0.1a or 0.2a while the other lattice element can have the size 0.3a. The lattice constant a can be, for example, from about 400 nm to about 600 nm, including all values and sub-ranges in between. As an example of relative shape, the shape of one lattice element can be square while the other lattice elements can be triangular, rectangular, or circular.

In some cases (not shown), the biatomic crystal at the center of the PhC 200' could be transitioned into a single-atomic crystal farther from the center of the cavity (e.g., see zone 320d in FIG. 3A) by gradually making the sizes of the two atoms in the biatomic crystal similar. This may eliminate any radiation from the PhC photodetector 200' away from the center (i.e., a region of the PHC 200' where the biatomic design is uniformly present) and can enhance the overall efficiency of the PhC photodetector.

GMR Polysilicon Film Photodetectors

Turning to photodetectors based on the second stop-band, as explained below, a GMR structure enhances optical absorption and enables efficient photodetectors to be fabricated out of materials which have low absorption due to, for example, thinness, low absorption coefficient, and/or the like. Such materials are common in microelectronics, such as in CMOS and bipolar-CMOS, and can include, but are not limited to, poly-crystalline silicon, amorphous silicon, germanium, silicon-germanium, and/or the like.

Figures 3A, 3B:
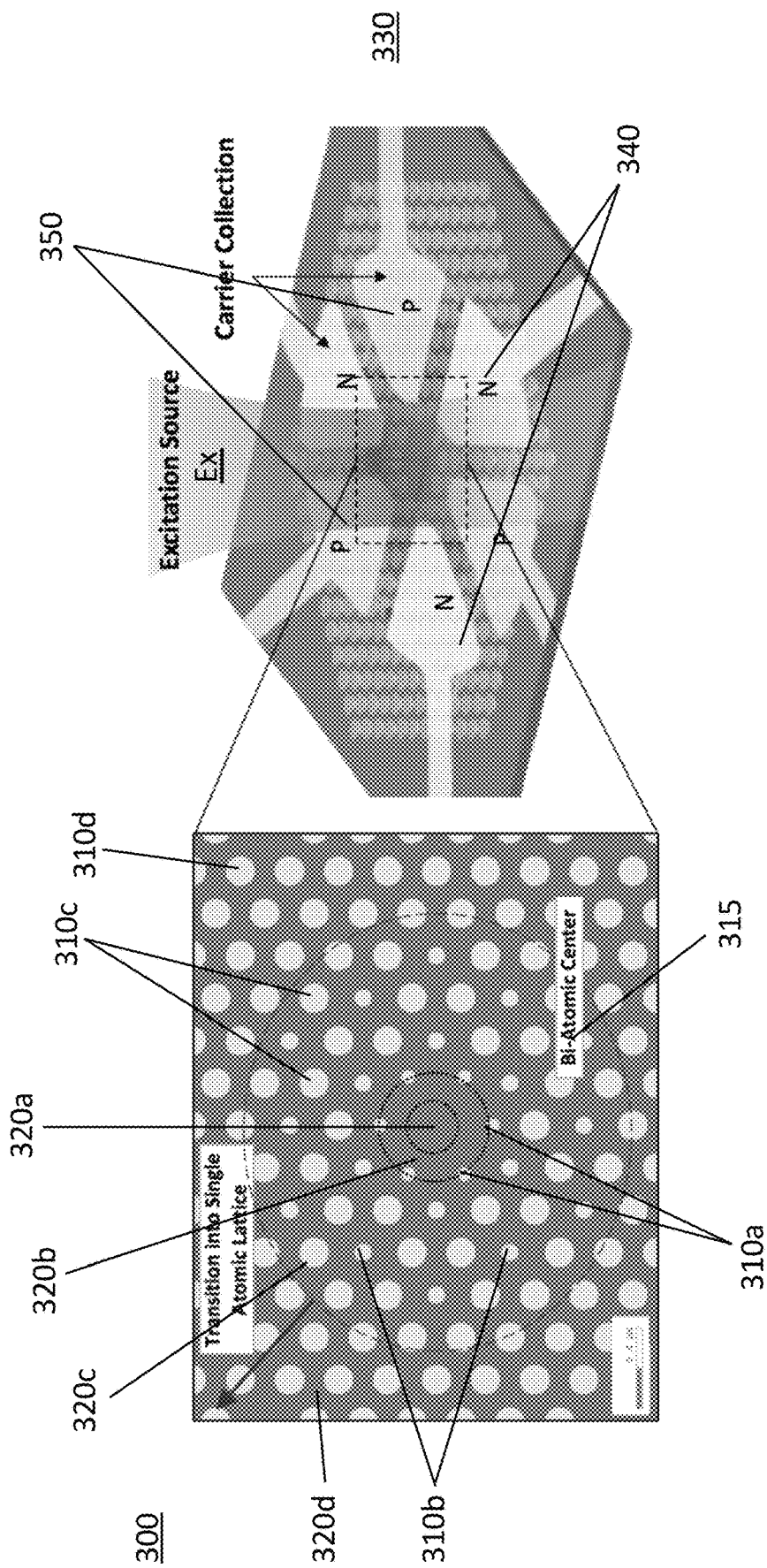
FIG. 3A illustrates a 2D biatomic resonator design for a photodetector.
FIG. 3B illustrates a photodiode fabricated based on the biatomic resonator design of FIG. 3A.

FIG. 3A illustrates an example biatomic PhC 300 that can be a component of a photodetector, a focal plane array (e.g., the focal plane array 360), a photodiode (e.g., the photodiode 330), and/or the like. The PhC 300 is illustrated as has a triangular lattice but may, in some cases, be a square lattice.

The PhC 300 includes lattice elements 310a, 310b, 310c, each having a different size. The lattice elements 310a can be smaller than the lattice elements 310b, which in turn can be smaller than the lattice elements 310c. FIG. 3A also illustrates a first zone 320a (demarcated by the innermost circle) as illustrated of the resonator 300 where a point defect in the PhC lattice structure is formed, and functions as a resonator responsive to an incident light beam Ex (e.g., a near-infrared (NIR) beam).

A second zone 320b (also demarcated by a circle having a larger radius than and concentric with the innermost circle of the first zone 320a) is defined between the lattice elements 310a and the first zone 320a. Generally, parameters of the structures closer to the center of the PhC 300, such as the size of the lattice elements 310a and/or the width of the second zone 320b for example, can be selected to control the resonator properties of the first zone 320a such as, for example, wavelength, quality factor, efficiency, and/or the like. The size of the lattice elements 310a can be about 0.1a (e.g., from about 40 nm to about 60 nm), where a is the lattice constant of the PhC 300.

A third zone 320c is defined outside (i.e., radiating away from the first zone 320a, demarcated by the outermost circle in FIG. 3A) the second zone 320, and includes a biatomic layout of the lattice elements 310b and the lattice elements 310c, similar to that illustrated and explained for FIGS. 2B and 2D. The lattice elements 310b and 310c may have different sizes, with each size from about 40 nm to about 200 nm, including all values and sub-ranges in between. During operation as a photodetector, an evanescent tail of the resonator mode of the first zone 320a can couple to the plane wave modes radiating in this third zone 320c away from the plane of the PhC 300.

A fourth zone 320d is formed outside the third zone 320d and exhibits a single-atomic design including lattice elements 310d, similar to that illustrated and explained for FIGS. 2A and 2C. The lattice elements 310d can be similarly sized/shaped to the lattice elements 310c, or be different (e.g., larger than the lattice elements 310c). This zone 320d can have the required or desired bandgap for containing the resonator mode to the center of the device, within the zone 320a. Said another way, the bandgap of the zone 320d can be large enough to prevent any light leakage, and this can be accomplished by selecting, for the lattice elements 310d, a size/radius that is larger than any of the other elements 310a, 310b, 310c. This can ensure that the fourth zone 320d has a bandgap that can confines any cavity mode of the PhC 300.

FIG. 3B shows an example p-i-n (PIN) photodiode 330 fabricated using the PhC 300. The photodiode 330 can include a substrate (not shown, see FIG. 3C) on which the PhC is formed, deposited, and/or otherwise coupled to. The photodiode 330 includes N-doped implants 340 and P-doped implants 350, illustrated here as laid out in hexagonal symmetry/pattern. The hexagonal layout permits metal electrodes (not shown, attachable to ends of the implants 340, 350 extending away from the zone 310a) for the implants 340, 350 to be brought close(r) to the center of the photodiode 300, but at locations where the electromagnetic energy of the resonator mode is close to zero. Other layouts for the electrodes are possible as well such as, for example, rectangular P-doped and N-doped electrodes/implants laid out in a line with the cavity mode. Each would have a rectangular shape, and I overlapping with the cavity mode.

During use, the incident light is focused on to the detector using a lens. The focused light energizes the optical cavity mode, which absorbs the incident photons and generates free-carriers inside the lattice. The free carriers are swept out with the electric field between the P and N regions of the diode through the applied bias to the diode. The swept carriers produce the photocurrent, which is the output of the detector.

Figure 3C:
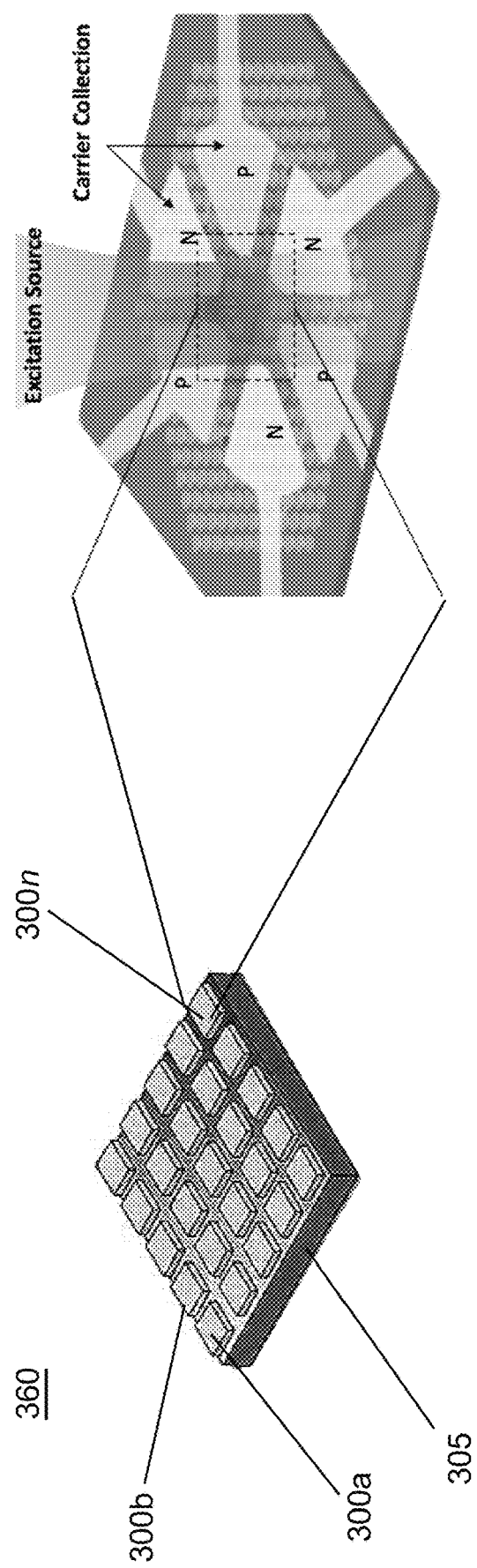
FIG. 3C illustrates a focal plane array fabricated based on the biatomic resonator design of FIG. 3A.

FIG. 3C shows an example focal plane array (FPA) 360 fabricated using multiple PhCs 300a, 300b, . . . 300n. The PhCs can be formed on, deposited, and/or otherwise coupled to a substrate 305, which can be, for example, a silicon substrate. Interconnects for the implants 340, 350 can be formed as vias through the substrate 305.

Polysilicon and silicon-germanium (SiGe) are attractive materials for use in such PIN photodiodes as they are found in most traditional and advanced CMOS processes. Polysilicon is the dominant material used for the gate of transistors. It is also sometimes used for building resistors. SiGe is typically used for straining the channel transistors for enhancing their speed. The thickness of these films is 50 nm to 200 nm, which is usually too thin to be used for efficient photodetection. However, these films can be patterned with very fine lithography resolution, enabling implementation of GMR and/or PhC cavity designs (e.g., the GMR design illustrated in FIGS. 3A, 3B, or the 2D biatomic design of FIGS. 2B, 2D) within these films for enhancement of optical absorption.

In order to achieve desirably high enhancement of optical absorption in these photodetectors/devices, films used for implementing photodetectors (e.g., polysilicon or SiGe) can be placed on or coupled to an optical isolation layer. Such optical isolation layers are already employed for silicon-on-insulator CMOS processes and can include, for example, a silicon dioxide film that is often referred to as a buried oxide (BOX). Typically, this BOX is less than 200 nm in thickness in advanced CMOS nodes. The silicon substrate under this thin BOX can be removed to prevent radiation of the resonator mode into the BOX.

In some cases, instead of removing the silicon substrate and to ensure that the resonator mode of GMR or PhC cavities does not radiate into the BOX, a thicker BOX (e.g., more than 500 nm in thickness) can be employed.

A GMR design can also be realized as generally disclosed in Examples 1-3.

Benefits of Polysilicon Detectors—Quantum Efficiency (QE) Response

One characteristic of polysilicon detectors is a flat quantum efficiency (QE) response from zero to a few volts of reverse bias. This QE (0.1-1%) at zero-volt bias, where dark current is zero, provides an opportunity for polysilicon detectors, such as those illustrated in FIGS. 2B, 3A, and 3B, to achieve a detection dynamic range comparable to commercial CMOS image sensors, e.g., up to 120 dB. For this purpose, a low-noise transimpedance amplifier (TIA) can be implemented in the silicon substrate of the detector and used for amplification and read-out of the detector current signal. The detector-TIA unit cell can serve as the pixel of an infrared imaging system.

Optical Absorption Mechanisms

The biatomic and GMR polysilicon detectors disclosed here exhibit mid-bandgap absorption by employing crystalline defects; however, another approach can include the incorporation of foreign atoms in the bulk of the polysilicon film. Foreign atom defects generally break the periodicity of the PhC and generate states with energy levels within the bandgap. These defects can be intrinsic to some materials such as polysilicon, or can be induced into silicon based devices, such as via ion implantation.

Yet another approach useful for optical absorption, and usable to generate the PhC designs described here, is surface state absorption, in which the termination of the crystal structure at the surface of a semiconductor distorts the semiconductors' band structure and creates intra-gap states, resulting in sub-bandgap light absorption.

Yet another approach useful for optical absorption, and usable to generate the PhC designs described here, is two-photon absorption (TPA). In TPA, the simultaneous and direct absorption of two photons results in the generation of an electron-hole pair. TPA scales with the square of the optical intensity, which, due to high the confinement level in silicon-based devices, could be significant even at mW-level powers.

Large-Area, Thin-Film Polysilicon Imagers

The electronics for the amplification and read-out of resonant polysilicon detectors, such as those described and illustrated in FIGS. 2B, 3A, and 3B can be implemented in the same polysilicon film used for the detectors—e.g., a thin-film transistor (TFT) technology. TFT polysilicon switches are utilized in display technology today, and a range of analog and read-out circuit have already been implemented in TFT polysilicon. Implementing both the resonant detector and read-out electronics on one polysilicon film provides unique opportunities for implementing low-cost and large-area infrared detector and sensor arrays. These sensors can be implemented on a wide range of substrates from silicon to glass to flexible plastics.

Surface-illuminated infrared detectors have been widely used in imaging and telecommunications. Epitaxially grown group III-V semiconductors are routinely utilized to form focal plane arrays (FPAs) and high-speed photodiodes for these applications. The high processing cost of III-V semiconductors, however, has made III-V solutions that involve large-scale integration, such as FPAs and imagers, cost-prohibitive for many applications.

Applications that are significantly and adversely affected by such cost-prohibitions include imaging and ranging. Short-wave infrared (SWIR) light (e.g., 1.2 μm to 2.5 μm) exhibits significantly lower scattering in fog and smog, providing greater visibility for a range of civilian and military applications. The maximum ocular exposure limit is also one to two orders of magnitude higher for this wavelength range than for visible and near infrared (NIR) wavelengths. This allows the use of higher optical power in active illumination imaging and ranging systems such as light detection and ranging (LiDARs), enabling imaging and ranging over greater distances. This longer range can significantly enhance the capabilities of autonomous driving systems that heavily rely on vision and ranging sensors. Nevertheless, the lack of a cost-effective infrared imaging system has significantly impacted the capabilities of these systems.

An emerging application that could also greatly benefit from cost-effective infrared FPAs is free-space optical (FSO) communications, now considered a promising candidate for 5G network backhaul. FSO systems are also considered promising as the trunk-line of long-haul communication networks for under-developed areas. In these applications, also, SWIR wavelengths are preferred over visible and NIR wavelengths, due to both lower attenuation in the atmosphere and higher permissible optical powers.

Alternatives to III-V semiconductors for infrared absorption include germanium (Ge) and silicon-germanium (SiGe). Ge absorbs light with wavelengths as large as 1600 nm and is compatible with silicon micro and nano electronics. Surface-illuminated detectors have been demonstrated with high quantum efficiencies and bandwidths. These detectors typically have dark currents of around 1 μA, which results in a shot noise that is too high for many imaging and ranging applications.

Figures 1A, 1B:
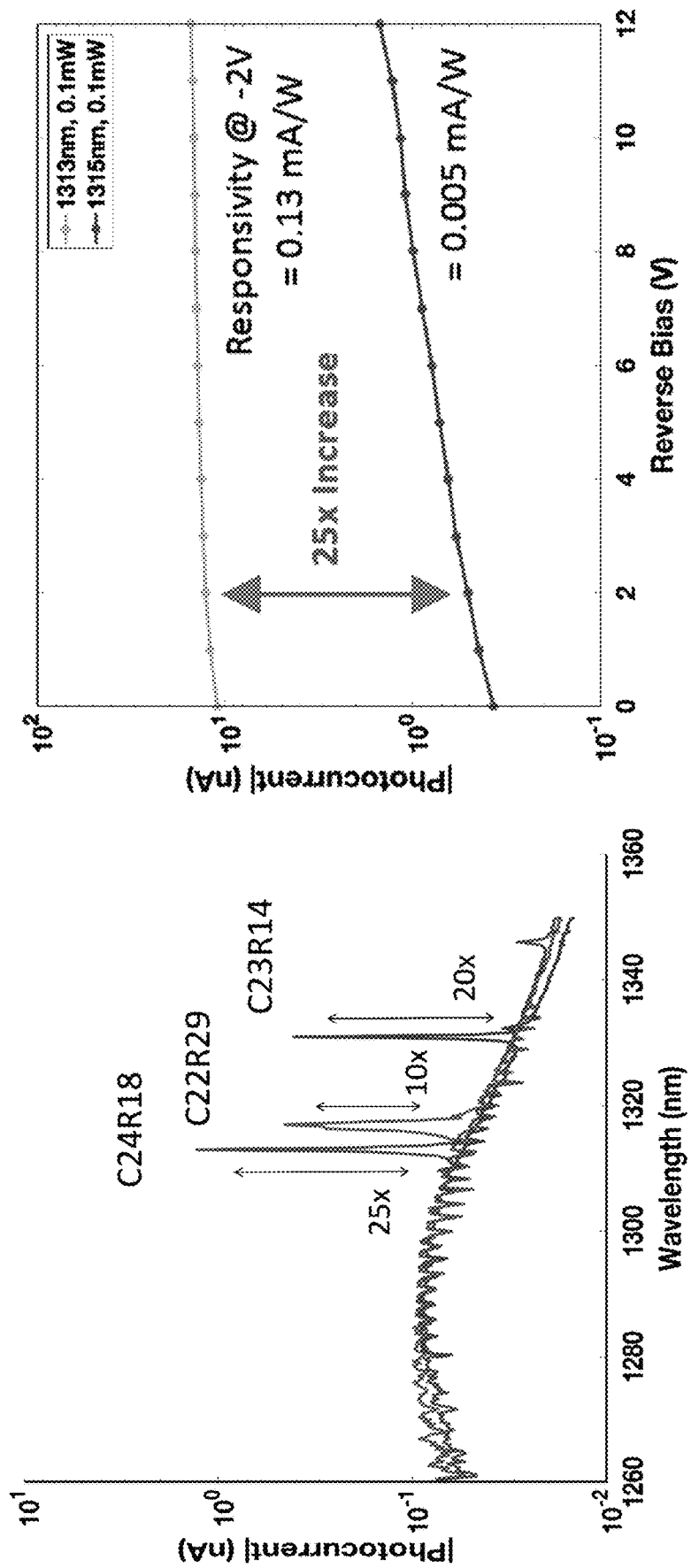
FIG. 1A is a plot illustrating photocurrent of three different PhC cavity-enhanced detectors as the wavelength of illumination is swept across resonance. A C24R18 device shows a factor 25 enhancement in photocurrent.
FIG. 1B is a plot illustrating the I-V curve of the C24R18 detector of FIG. 1A, when the illumination wavelength is tuned to the resonance of the detector cavity.

To overcome these deficiencies and to facilitate the applications described here, demonstrated is a photonic crystal resonator in polysilicon film (e.g., a 220 nm thick polysilicon film) i.e., as an in-plane resonant defect mode in the first stop-band of the polysilicon photonic crystal. A lateral PIN junction can be formed around the resonator to implement a PIN photo-diode (e.g., see FIG. 3B). The I-V characteristic of the photodiode of FIG. 3B under illumination shows a resonance enhancement factor of 10-30 for horizontally polarized light, as illustrated in FIGS. 1A and 1B. The resonance enhancement can allow for achieving a quantum efficiency (QE) that is two orders of magnitude higher than SiGe detectors previously implemented in CMOS.

Example 1

The increase in demand on efficient sensors for light ranging, thermal-cameras, and free-space optical communications is resulting in a gap between the commercial needs and the state-of-the-art. Here, different PhC Detectors are designed and compared, including across factors such as on and off-resonance, Q-factors, coupling factors, and/or the like. FIG. 5 presents an overview of characteristics of different types of Si-based NIR detectors.

Layout and Fabrication

The photonic devices' layout consists of 1088 devices that are designed in an industry standard design tool, Cadence Virtuoso. The designs are then implemented in a 65 nm CMOS process and fabricated on 300 mm wafers at the Center for Nanoscale Science & Engineering (CNSE). See FIG. 21 for the layout of the 1088 devices, and FIGS. 6 and 20 for the individual device layout. Each device is approximately 12 μm wide (diameter) and 220 nm thick. A diagram of a sample design showing the different parameters is shown in FIG. 6.

This base structure is designed to balance between confinement and coupling. For example, a structure that can confine light should have low coupling with incident light; whereas a structure that can easily couple to incident light will be a poor resonator. Therefore, there is some optimum design between the two extremes at critical coupling. One metric used to describe this tradeoff along with the resonator overall is the Q/V enhancement factor. To maximize the detector performance by maximizing and/or generally improving detector responsiveness to the incident light, a critically coupled resonator with high Q-factors and smaller modal volumes is desirable.

Each device includes a unique set of six parameters that together determine the bandgap, coupling efficiency, and center resonance wavelength. The parameters are shown in Table 1 with their range of values. For example, a is the radii of the periodic holes, and $r_d$ is the resizing of radii near the defect. Since the structures are limited in lateral distance, one can increase the in-plane coupling with incident light. The idea here is to introduce a perturbation that is symmetric in the xy-plane such that the effective defect has a stronger z-component coupling. Having this image in mind, a selection of holes is shrunk symmetrically in layers surrounding the defect. The final defect structure takes a biatomic shape. The degree of shrinkage (r/a) and number of layers affected (Defect Layers) is varied.

TABLE 1

The six design parameters for the photonic crystal and their respective values. Values are swept to create 1088 different variants of detector design. A visual representation of the parameters is shown in FIG. 6.

| Lattice Constant (a) | 0.37-0.40 μm | $r_d$/a | 0.1-0.2 |
|---|---|---|---|
| r/a | 0.17-0.35 | Defect Shift/ a | 0.1-0.25 |
| r'/a | 0.17-0.35 | # Defect Layers | 1-3 |

Experimental Characterization

PhC cavities can be characterized by their enhancement factor, Q/V. Like any resonator, this factor fully describes the cavity losses independent from the characteristic scale of the resonator. A higher enhancement factor leads to larger free-spectral-ranges paired with high selectivity (small resonator bandwidth); this is a desirable effect regardless of the application as it enables increased spectral resolution over a larger range. Generally, the bandwidth is a measure of how fast the detector responds and differentiates between two successive signals, and can be extremely important in high-speed applications such as optical modulators and light communication. Here, since free-space detection is employed, bandwidth is a relatively lesser concern than factors such as propagation distance and medium.

The Q/V value can be estimated by drawing from measured data and simulations. For example, a comparison between on and off resonance photocurrent leads to estimating the enhancement in the detector's sensitivity. The higher the enhancement factor, or extinction, the more sensitive the device is to incident light of that wavelength. Since PhC cavities are efficient light-confining structures at extremely narrow linewidths, PhC detectors should be narrowband as well. Photodetectors are primarily characterized by their current responses with varying voltage, wavelength, and input power.

Characteristic I-V

One insightful characteristic of a detector is its response to an applied voltage, both forward and in the reverse direction. The forward direction shows whether there is a "healthy" exponential relation between current and voltage as would be expected in a PIN junction. A different relation such as linear or quadratic would suggest that there is an abnormally high tunneling of current or some leakage. Such a response implies that the detector junction is somewhat ill-designed or damaged.

Figure 7B:
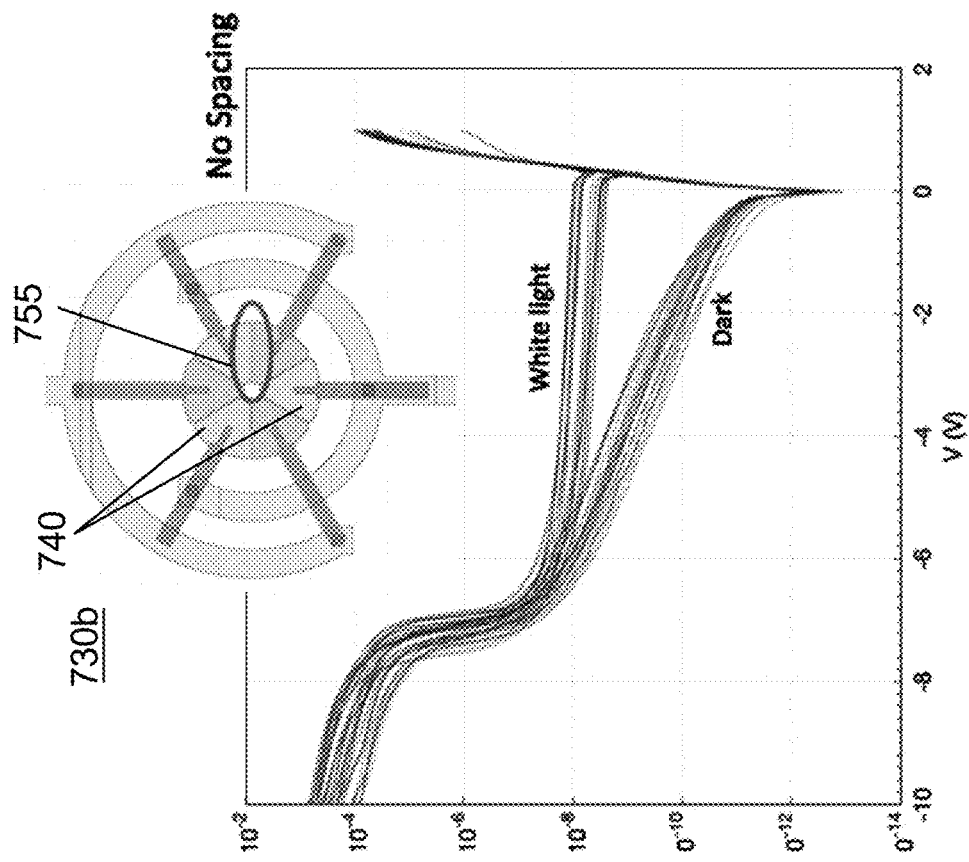
FIG. 7B is an I-V graph of a photodetector with 0.4 µm PN spacing, measured under direct white-light illumination and dark conditions. A diagram of the corresponding device junctions is shown above the plot.
Figure 7A:
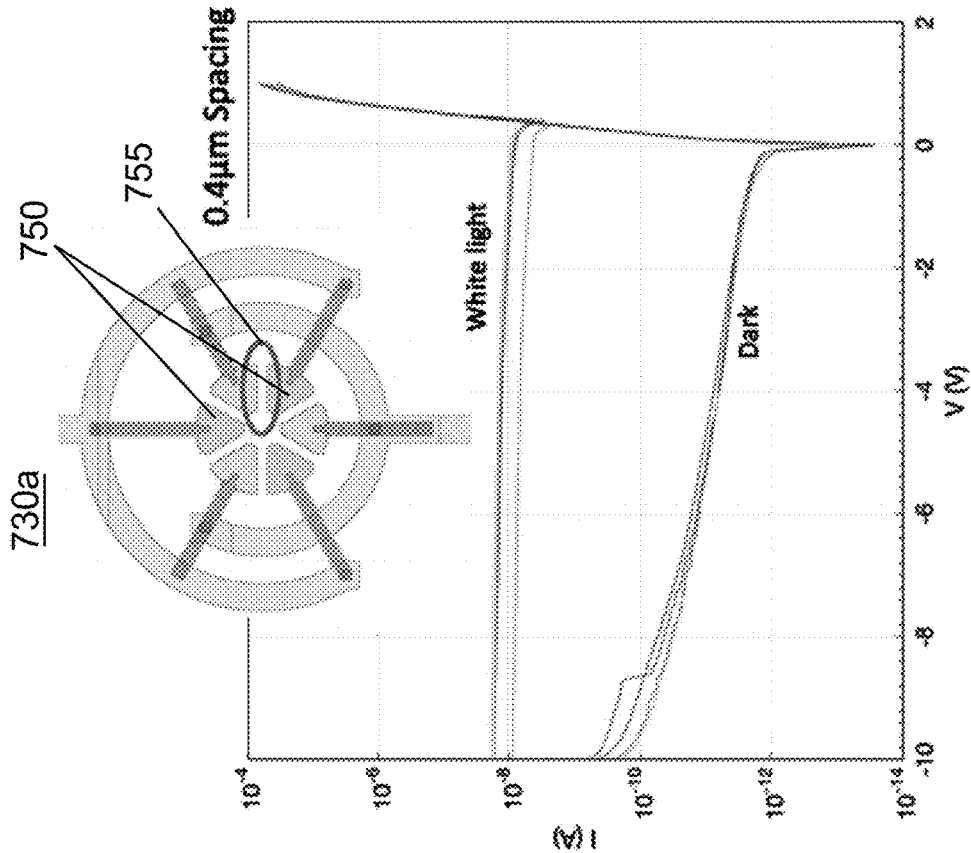
FIG. 7A is an I-V graph of a photodetector with 0.4 µm spacing (left) and 0.0 µm spacing (right) between adjacent P and N regions, measured under direct white-light illumination and dark conditions. A diagram of the corresponding device junctions is shown above the plot.

FIGS. 7A and 7B show the I-V curves of two measured devices 730a, 730b. Out of the tested devices the I-V characteristic is overwhelmingly determined by a single junction parameter. The shape of the device junction is circular with P regions 740 and N regions 750 combining in the middle making a shape that resembles spokes on a wheel. The spacing 755 between where the different spokes meet is varied and chosen to be either 0.4 μm (FIG. 7A) or 0.0 μm (FIG. 7B). When the spacing is 0.4 μm as illustrated in FIG. 7A, the I-V curve has a more traditionally, well-behaved shape: a high breakdown voltage (≈−16V) and low current dependence in reverse bias. However, when the spacing is removed as illustrated in FIG. 7B, the favorable diode-like characteristics diminish, a large tunneling current, an increase in noise, and a premature breakdown is observed.

Even though they are the minority out of the 1088 devices, the following analysis focuses on the 0.4 μm PN spacing devices as they present the more favorable diode characteristic curve and dynamic range. This type of device has a dark current of 3.9 pA at 2 V reverse bias. Generally, the dark current encodes information on the noise profile of a detector given by its noise-equivalent power or NEP.

The Free-Space Setup

Some of the applications here are aimed at considering the Fraunhofer approximation of planar electromagnetic waves. Free-space communication for example, looks at planar waves and their interactions with matter.

In this setup, a 20×NIR Mitutoyo objective (working distance=20 mm) was used to focus a free-space beam of 1300 nm laser onto the PhC chip. The beam was then aligned using an InGaAs camera sensor (Xenics's Xeva 1.7) on the surface of the on-chip detector. The image of the PhC chip surface seen from the InGaAs camera sensor in this setup is shown in FIG. 8.

Spectral Response

Table 2 presents the cavity parameters of the three devices (C24R18, C22R29, and C23R14) with the highest Q-factors. A reverse bias plot of the device with the highest Q-factor is shown in FIGS. 9A and 9B.

The resonance mode of the cavity is largely sensitive to changes in wavelength, down to the order of 0.1 nm (FWHM). The spectra measured of the three devices shows the common background where the photonic crystal is insensitive to the color of light. However, a slight change into the resonance results in 25-, 20-, and 10-fold increases, respectively, for the three devices in photocurrent than the corresponding off-resonance value of the photocurrent. The optical power was kept constant while the frequency was swept; due to this fact, responsivity of the three devices is also enhanced by the same factors (i.e., 25, 20, 10 times). Generally, at a given wavelength, the responsivity of a detector encodes information on its conversion efficiency, which is normally stated as the detector's quantum efficiency. The quantum efficiency, or $\eta_{QE}$, is all the internal mechanisms and generation that give rise to a photon-electron conversion rate. It is found by the expression $$\eta_{QE} = \frac{R}{q/\hbar\omega} \quad (1.3)$$

where R is the responsivity, q the elementary charge, and $\hbar\omega$ the energy of one photon. R is the parameter enhanced for resonator devices. Depending on the value of Q/V, the detector resonates.

As a point of comparison, a 220 nm thick slab of crystalline silicon has an absorption depth of $12.5 \times 10^4$ 1/cm at 1.33 µm. For such an absorption and slab thickness the quantum efficiency (assuming no reflection on surface) is $\eta_{QE} = 1.76 \times 10^{-9}$ and a responsivity of $R = 1.89 \times 10^{-6}$ mA/W.

TABLE 2

PhCC parameters of the three highest performing devices (shown in FIGS. 9A and 9B).

| Device | $R_1/a$ | $R_2/a$ | $R_d/a$ | Shift/a | Layers |
|---|---|---|---|---|---|
| C23R14 | 0.31 | 0.31 | 0.2 | 0.1 | 3 |
| C22R29 | 0.297 | 0.33 | 0.2 | 0.1 | 3 |
| C24R18 | 0.33 | 0.33 | 0.2 | 0.1 | 3 |

Supermodal Splitting

Resonance splits (referred to as supermode splitting or supermodal splitting) as shown in FIGS. 10A and 10B have been observed in PhCC designs. Splits occur when a vital parameter to the resonance is adjusted (through the defect or its environment), while keeping the surrounding lattice untouched. For example, the defect can be shrunk or moved away from its nominal lattice site. Such a modification creates a superposition of modes between the pre-existing mode before the modification and the nearest mode after the modification. It is called a supermode due to the presence of two or more interacting modes in the cavity.

The Lensed-Fiber Setup

To understand the device operation under direct fiber excitation a 2.5 µm beam-waist lensed fiber was used in the setup of Example 1 in place of the focusing objective. The fiber and a responsivity measurement are shown FIGS. 11A and 11B, respectively. The working distance of the fiber is 10-15 µm.

Spectral Response

The discrepancy between the Far Field (0.13 mW/A) and Near Field (0.05 mW/A) responsivities can be due to the limited polarization control of the lensed fiber setup. As seen in FIG. 11B, there is some energy in the split-off mode. The mode splitting in addition to the lack of polarization control poses serious concerns: a lower extinction ratio (20× instead of the 25× seen in far field) and much lower Qs. There are two methods that can be used to resolve this discrepancy. One way is to optimize the design such that there is no resonance split as discussed above.

Spot Size & Linear Dynamic Range

Before characterizing the spot size, it is useful to determine the linear operating range of the detector. Generally, in a photodetector, there exists a range where the incident power is linear with photocurrent. This region, between the noise level and current saturation, is called the linear dynamic range (LDR) of the detector. A plot of this range is shown in FIG. 12A.

To be seen in a high-quality silicon microelectronic process, the LDR of the fabricated devices is high with a reasonably low noise floor making the device more sensitive even at low input powers/responsivities. In the following sections all experimental data was taken in the LDR of detectors.

FIG. 13 shows a plot for estimating the spot-size of the beam. This plot was generated by scanning the power against spot location. Using a lensed fiber, and assuming a Gaussian profile, a general approximation of the beam waist can be determined. The plot shows a very sharp drop in intensity after approximately 3 µm which agrees with an approximate analytical calculation of the beam waist of 3.2 µm calculated from the knife-edge measurement formula (provided in the Knife-Edge Measurement Formula section of Example 3).

Example 2

Software and Resonator Design

In conjunction with experimental verification, it is useful to investigate the theoretical limit of device performance. Fabricating and testing can easily become intractable, especially with large overhead costs. Therefore, researchers have developed numerical tools to model light-matter interaction which avoids risks and opens more avenues of exploration. Some of the tools used are a Finite-Difference Time-Domain (FDTD) analysis and Field-Element Method (FEM) along with many others.

Here, an industry-standard field simulation tool, Lumerical Solutions, and the MIT Electromagnetic Equation Propagation (MEEP) library were used to model and test the PhC cavities disclosed herein. Both Lumerical and MEEP use FDTD. A 3D simulation of the PhCC slab mode made in Lumerical is shown in FIGS. 14A and 14B.

MEEP was used to visualize the cavity mode and calculate the transmission spectrum of the cavity modes. The cavities structure was implemented in a Python script and the same designs from a fabricated array were used. The goal of Example 2 was to model and verify the experimental results as well as predict trends. However, there are limitations to the method of Example 2 since a real device is surrounded by various layers of dielectric masks that increase the complexity of the structure. In the MEEP simulations, a copy of the PhCC was built without the additional layers. For the MEEP calculations in the Band Structure and Transmission Spectra section of Example 3, a 2D photonic crystal was implemented with $n_{polySi}=3.5$ and $n_{so2}=1.5$.

Band Structure

Characterizing a PhC begins by first engineering the bandgap. Since the range of frequencies is chosen based on the fabricated devices, bandgaps that cover a portion of the NIR range (namely 1.1-1.6 μm) were found. The type of photonic crystal used was a thin slab 2D-PhC with triangular lattice arrangement. To solve for the band structure, the MIT Photonic Bandgap (MPB) package provided by MEEP was used. The geometry is defined with a lattice constant and radii as shown in FIGS. 15A-15C. The primary Brillouin zone $\bar{k}$ vectors (Γ, K, M) are defined as described in FIGS. 15A-15C as well as the number of bands to calculate. A quick simulation shows that a full bandgap is present between frequencies 0.48-0.79 (c/a) for a lattice constant and radius of 0.4 μm and 0.33a, respectively. This bandgap spans the desired range.

Removing a single unit cell from the lattice introduces modes within the bandgap. Light of the frequency is trapped as if in a perfect mirror. Light of that frequency is able to resonate with Q-factors of 1.5-3 k. Diagrams of the resonant $\hat{H}_y$ and $\hat{H}_z$ modes are also shown in FIGS. 15B and 15C, respectively.

Cavity Modes & Coupling Efficiency

Given the finite thickness of the 2D PhC slab in FIG. 6, light is confined in both in-plane via the PhC and out-of-plane via the dielectric slab. The given geometry has several effects on the loss and coupling efficiency of the cavity. Analyzing a device in 3-dimensions can quickly become complicated and computationally intractable, however, there are two ideas that take advantage of the pronounced symmetry of this structure as well as some knowledge in the eigen-modes. The relation between the total Q and its in-plane and out-of-plane components can be drawn from energy conservation:

$$\frac{1}{Q} = \frac{1}{Q_\perp} + \frac{1}{Q_\parallel}. \tag{3.1}$$

This equation suggests that by making a larger lattice, $Q_\parallel$ can be arbitrarily high. The limiting factor in photonic crystal slabs' confinements becomes $Q_\perp$.

The second idea can be seen from the perspective of waveguide theory. A mode propagating in a slab with thickness d (220 nm in the experimental case) has an effective index lower than the material index. The broadening due to this effect reduces the overlap between the photonic crystal and the mode. The same conclusion can be reached from the perspective of PhC theory; it can be thought of as the low index contrast pushes the bandgap to lower frequencies. The next two sections of Example 2 address the PhCC coupling problem through optimizing for the discussed structures.

Transmission Spectra

Furthermore, it is useful to understand the characteristics of the cavity (or defect) when different alterations are applied. FIGS. 16A-16C and FIG. 17 show two different experiments highlighting the effects of defect and lattice alterations on the Q.

In FIGS. 16A-16C and FIG. 17, a Gaussian dipole source was placed in the center of the cavity centered at the resonance frequency. Next, a flux region calculator was placed surrounding the slab which measures the in-plane Poynting vector flux exiting the region. The calculation of $Q_\perp$ provides the sufficient lattice size to maximize the total Q. Normalizing the output of the flux calculation to the initial intensity of dipole outputs the transmission at of the slab per frequency.

FIGS. 16A-16C show the transmission loss between an altered and unaltered cavity; more specifically, the shrink parameter was applied to the unit cells surrounding the lattice.

FIG. 17, on the other hand, shows the effect of increasing the size on $Q_\parallel$ (and thereby the total Q). Since a finite size crystal is not a perfectly periodic environment, the bandgap is not well defined. However, with a sufficiently large crystal, Q' can be arbitrarily high. From the plot shown in FIG. 17, increasing the size reduces loss and increases the Q-factor.

A byproduct is that the enhancement factor slightly goes down from panel c to panel d of FIG. 17. The slight drop of the extinction makes sense since a perfect resonator would not allow any light to escape, so the extinction goes down even though there is higher internal confinement (i.e. $Q_{int} > Q_{ex}$).

Example 3

After both empirical and numerical analysis of the photonic crystal cavity detectors, Example 3 focuses on the implication and interpretation of the results of the previous examples. In this the Noise section of Example 3, the detectivity or a detector and how it compares with other enhancement mechanisms are disclosed. The extent and limitations of the numerical model developed are disclosed in the Numerical Agreement section below.

Noise

It is possible to determine the total incident power, estimate the spot size, and finally, calculate the dynamic range given values of the responsivity and dark count rate. On resonance, the responsivity of the enhanced detector is 0.1 mA/W. The dark current, on the other hand, can be determined using the shot noise relation.

With more than one noise source in a detector, the noise can easily get difficult to measure. It is common practice to estimate the most dominant type of noise as the first order approximation to noise analysis. This problem can be reduced by assuming a uniform illumination source and a linear efficiency. It follows that the noise expression reduces to primarily current generated during the absence of a signal either through electrical noise or background light. This type of noise is usually referred to as the dark current and is regarded as a Poissonian random process since the arrival events are temporally sparse and uncorrelated. The variance of current produced through this white noise process is given in the expression, $$\langle i_s^2 \rangle = 2qI_d\Delta f, \tag{4.1}$$

where $I_d$ is the dark current, q is the charge of the electron, and $\Delta f$ is the noise spectrum range.

With a dark current of 3.5 pA and a given responsivity as well as a Poissonian model of shot noise, it is possible to estimate a value for the noise-equivalent power (NEP). NEP is a notable figure-of-merit which encodes information on the sensitivity of the device. It is usually expressed in W/$\sqrt{Hz}$ and is given by the expression, $$NEP = \frac{1}{R}\sqrt{\frac{\langle i_s^2 \rangle}{\Delta f}} = \frac{\sqrt{2qI_d}}{R}, \tag{4.2}$$

where R is the responsivity. The intuitive explanation of NEP is that it describes how much power is needed to overcome the internal noise of the device and generate an "on" signal. The lower the value, the less power is needed to reliably identify a presence of a signal. Hence, 1/NEP is naturally referred to as the detectivity, D, of the device. Using the values and expressions above the PhCC device has a NEP of approximately 8.2 pW/√Hz assuming a flat spectral range of $\Delta f$.

FIG. 18 presents devices that use different materials and enhancement mechanisms as discussed in previous sections. As shown, even with a responsivity of only 0.13 mA/W, the inventive PhC devices, with their high dynamic range, provide the lowest NEP, and therefore, the highest detectivity.

Numerical Agreement

The examples disclosed herein report a resonance enhancement empirically and numerically developed PhCC slab constructed using polycrystalline silicon. In both cases, a strong confinement within relatively narrow bands (Q~$10^3$) was noted. Using a lattice constant of a=0.4 µm and rod radii of around r/a=0.31-0.33, and height of 220 nm it was demonstrated that photonic bandgaps act as a highly selective filters for telecom, and more broadly NIR wavelengths. By tuning the parameters of the defect cavity, it is possible to fine-adjust the peak resonance.

FIG. 19 applies the numerical model developed to the three highest performing measured devices. FIG. 19 reveals the agreement between the model and experimental trend by solely adjusting the lattice and defect parameters shown in Table 1. The predictive power of the model lies in revealing the effect of a change, i.e., whether this change increases or decreases the resonance wavelength and the quality factors, even for complicated changes (such as the alternating biatomic effect). Example 3, however, does not predict the exact location of the peaks; as discussed in the Software and Resonator Design section above, this involves knowledge of the surrounding environment of the fabricated PhC slab (e.g., surrounding structure, surrounding indices, doping density, temperature) which is process dependent, and less generally applicable. For this reason, a different peak wavelength is seen when directly comparing experimental (1313, 1317, and 1331 nm) and numerical (1503, 1520, and 1543 nm) results as shown in FIG. 19.

In summary, optimized PhCC structures have been presented with Q-factors up to 6500 and high extinction peaks due to Q/V of the order $10^{16}$ cm$^{-3}$. The purpose of using PhCC structures is to provide the missing link for surface-illumined detectors by efficiently coupling incident beams into transverse layers giving a CMOS-compatible design. The same devices have been numerically visualized and verified using FDTD. Design matrices such as photonic crystal size and defect parameter allocation have been optimized for critical coupling with surface-illuminated light. Additional optimization of the PhCC can also be performed. For example, introducing slab thickness and dielectric constant variation in the model can further guide future design iterations, specifically for CMOS environments.

With a dark current of 3.5 pA the shot noise in a Poissonian process can be estimated, that gives a NEP of 8.2

$$\left(\frac{pW}{\sqrt{Hz}}\right),$$

the lowest value in comparison with detectors in FIG. 18. Although responsivities are below commercial III-V detectors (0.9 W/A), the high signal-to-noise ratio at zero-bias and integration into microelectronic processes opens countless possibilities for the future of PhCC detectors. For example, an array of packaged PhCC detectors with a cascaded high-gain Trans-Impedance Amplifier (TIA) could be used to create a multidirectional, narrowband, NIR sensor die.

Additionally, the examples disclosed herein demonstrate that through using a resonance layer it is possible to enhance the sub-bandgap responsivity of polycrystalline silicon to an order of 0.1 mA/W.

Fabrication Dimensional Tolerances

FIG. 22 illustrates spectra for two of the devices, C23R11 and C23R14, with identical R1 and R2. The readjustment of the layers surrounding the hole does not have an overall effect on the structure. As discussed in Example 1, slight inaccuracies in the fabrication of the devices can lead to variations in the peak (supermode) resonances. Each curve in FIG. 22 shows the resonance split but the curves are slightly shifted. This can result from any rough edges or dielectric variation near the defect.

Beam-Waist Estimation

Knife-edge measurements are used to estimate the beam waist of a Gaussian beam by using a precise, sharp edged tool (such as a knife). By sweeping the location of the knife between the beam and some power sensor, the sensor side sees power as a function of lateral coordinate x, $$P(x) = P_0 + \frac{P_{max}}{2}\left(1 - erf\left(\sqrt{2}\frac{x-x_0}{w}\right)\right) \tag{5-1}$$

where $P_0$ is the power measured when detector completely covered (background), $P_{max}$ is the maximum power on the detector, w is the beam waist, and x–$x_0$ is the knife's lateral displacement.

When comparing this analysis to FIG. 13, a uniform area of the detector, where any region will have an equal probability of absorption, was assumed. Since the PhCC has much higher detectability near the cavity than in other regions of the detector and thus the area of the detector is not uniform. As a result there was not a clear error function, but a much sharper decline by moving away from cavity. Nonetheless, since only two points are needed from the plot (it is standard practice to choose x and x' at the % 10 and % 90 power) and the beam waist is on the scale as the detector, this method can be used as a rough estimate.

The maximum power in the knife-edge measurement of Example 3 is when the beam is centered at the cavity (FIG. 13 at x=0) with a photocurrent of 1.14 nA. The $x_{10\%}$ and $x_{90\%}$ are extracted based on this value and equation 5-1 is used to find the w=3.2 µm.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A photodetector, comprising:
   a substrate;
   a polysilicon layer deposited on the substrate and patterned to form a photonic crystal having a defect and a biatomic lattice surrounding the defect, to couple light from free space into a guided mode resonance of the defect;
   a p-doped region and a n-doped region, formed in the polysilicon layer, to apply an electric field across at least a portion of the biatomic lattice, the electric field sweeping free carriers generated by the light coupled from free space to the guided mode resonance; and
   a first electrode, in electrical communication with the p-doped region, and a second electrode, in electrical communication with the n-doped region, to couple a photocurrent generated by the free carriers out of the polysilicon layer.

2. The photodetector of claim 1, wherein the biatomic lattice has a first lattice constant and a second lattice constant, and wherein the photonic crystal has a first single atomic lattice at the first lattice constant between the defect and the biatomic lattice and a second single atomic lattice at the second lattice constant surrounding the biatomic lattice.

3. The photodetector of claim 2, wherein the second single atomic lattice has a bandgap containing the guided mode resonance.

4. The photodetector of claim 1, wherein the biatomic lattice includes a set of lattice elements, and wherein the shape, or size, or both, of the set of lattice elements is selected based on a desired extent of coupling of the light to the guided mode resonance.

5. The photodetector of claim 1, wherein the biatomic lattice is a triangular lattice or a square lattice.

6. The photodetector of claim 1, wherein the light is a near-infrared (NIR) optical beam.

7. The photodetector of claim 1, wherein the light is out-of-plane of the biatomic lattice, and wherein the guided mode resonance is in the plane of the biatomic lattice.

8. The photodetector of claim 1, wherein the defect is a point defect.

* * * * *